(12) United States Patent
Nakamura et al.

(10) Patent No.: US 7,075,391 B2
(45) Date of Patent: Jul. 11, 2006

(54) SURFACE ACOUSTIC WAVE FILTER ELEMENT, SURFACE ACOUSTIC WAVE FILTER AND COMMUNICATION DEVICE USING THE SAME

(75) Inventors: Hiroyuki Nakamura, Katano (JP); Keiji Onishi, Settsu (JP); Akio Tsunekawa, Moriguchi (JP); Shigeru Tsuzuki, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/166,495

(22) Filed: Jun. 24, 2005

(65) Prior Publication Data

US 2005/0237133 A1    Oct. 27, 2005

Related U.S. Application Data

(63) Continuation of application No. 10/283,375, filed on Oct. 29, 2002, now Pat. No. 6,930,570.

(30) Foreign Application Priority Data

Oct. 29, 2001    (JP)    ............................. 2001-330435

(51) Int. Cl.
 *H03H 9/64*    (2006.01)
(52) U.S. Cl. ...................................... 333/193; 333/195
(58) Field of Classification Search ......... 333/193–196
 See application file for complete search history.

(56) References Cited

U.S. PATENT DOCUMENTS

| | | | |
|---|---|---|---|
| 5,215,546 A * | 6/1993 | Cho et al. .................. 29/25.01 |
| 5,265,267 A | 11/1993 | Martin et al. ................ 455/326 |
| 5,892,418 A | 4/1999 | Onishi et al. ............... 333/193 |
| 6,023,204 A | 2/2000 | Ikata et al. .................. 333/193 |
| 6,388,545 B1 | 5/2002 | Kawachi et al. ............. 333/193 |
| 6,501,344 B1 | 12/2002 | Ikata et al. .................. 333/133 |
| 6,563,396 B1 | 5/2003 | Tanaka et al. ............... 333/133 |
| 6,570,469 B1 | 5/2003 | Yamada et al. .............. 333/193 |
| 6,710,514 B1 * | 3/2004 | Ikada et al. ............. 310/313 C |
| 2001/0043024 A1 | 11/2001 | Takamine et al. ........ 310/313 B |

FOREIGN PATENT DOCUMENTS

| | | | | |
|---|---|---|---|---|
| JP | 5-235684 | * | 9/1993 | .................. 333/195 |
| JP | 8-265088 | * | 10/1996 | |
| JP | 9-153758 | * | 6/1997 | |
| JP | 11-97968 | * | 4/1999 | |
| JP | 11-145772 | | 5/1999 | |
| JP | 2000-223989 | * | 8/2000 | |
| JP | 2001-244787 | | 9/2001 | |

* cited by examiner

OTHER PUBLICATIONS

"Transactions in 2001 on Foundation/Boundary Society Conference of Institute of Electronics, Information and Communication Engineers," Institute of Electronics, Information and Communication Engineers, Aug. 29, 2001, pp. 283-284 (w/English translation).

*Primary Examiner*—Barbara Summons
(74) *Attorney, Agent, or Firm*—RatnerPrestia

(57) ABSTRACT

A surface acoustic wave filter element has
 a piezoelectric substrate; and
 a plurality of inter-digital transducer (IDT) electrodes formed on the piezoelectric substrate,
 wherein at least one of the plurality of IDT electrodes is connected to a balanced type terminal and other IDT electrodes are connected to balanced type terminals or unbalanced type terminals, and
 first wiring electrode means which is connected or to be connected to the at least one IDT electrode and second wiring electrode means which is connected or to be connected to the other IDT electrodes are disposed on planes different from each other.

2 Claims, 18 Drawing Sheets

Fig. 8 (A) PRIOR ART
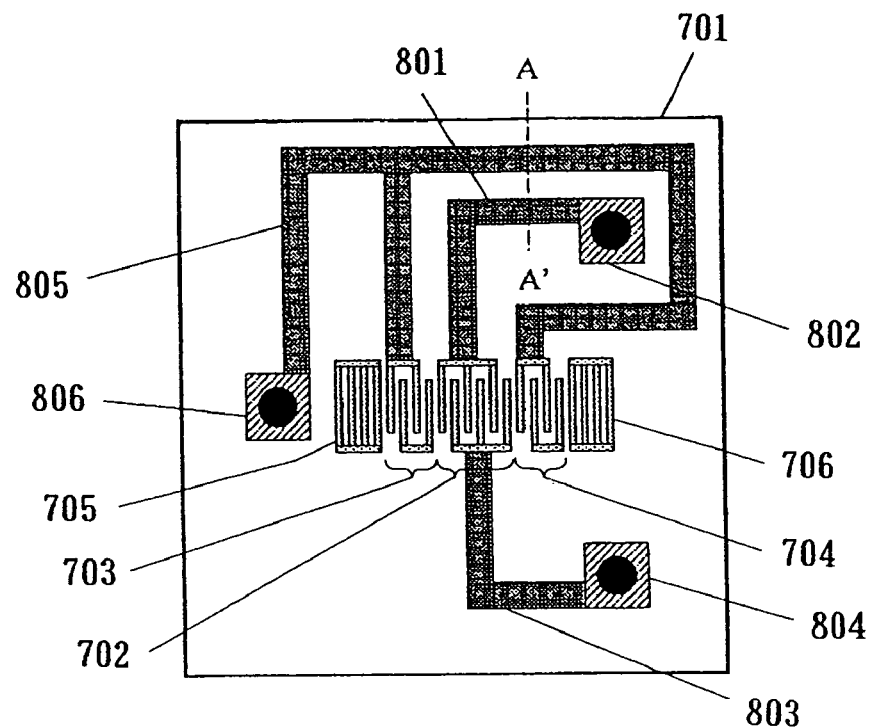
Fig. 8 (B) PRIOR ART
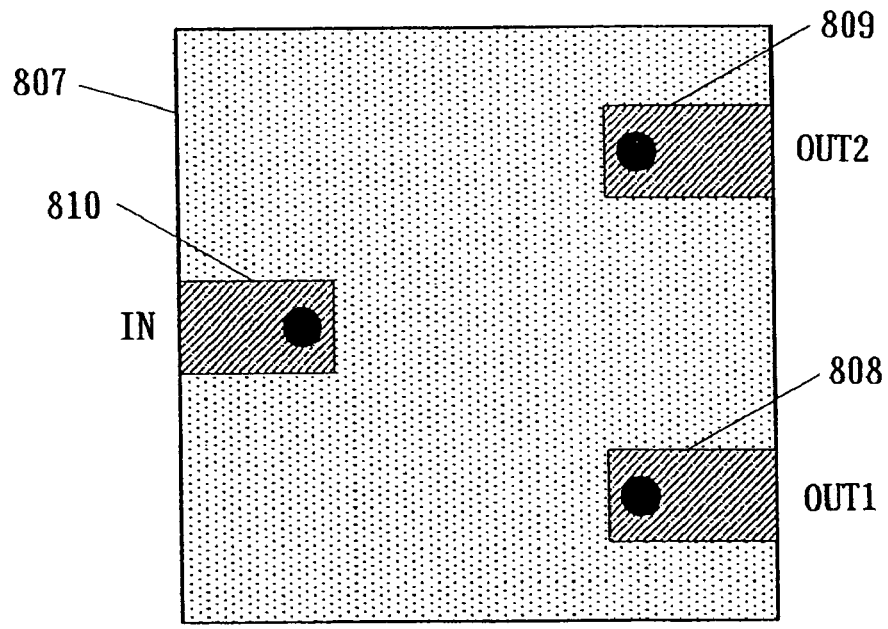

SURFACE ACOUSTIC WAVE FILTER ELEMENT, SURFACE ACOUSTIC WAVE FILTER AND COMMUNICATION DEVICE USING THE SAME

This application is a continuation of U.S. patent application Ser. No. 10/283,375, filed Oct. 29, 2002, now U.S. Pat. No. 6,930,570, the contents of which are incorporated herein by reference.

BACKGROUND OF THE INVENTION

1. Field of the Invention

The present invention relates to a surface acoustic wave filter element, a surface acoustic wave filter, a module and a communication device provided with balanced type terminals capable of suppressing deterioration of electric characteristics.

2. Description of the Related Art

With the development of mobile communications in recent years, there are expectations for improvement in performance and reduction in size of components used. Furthermore, balancing of semiconductor components such as ICs for the purpose of low noise characteristics is developed and balancing is also required for a surface acoustic wave filter element used in the RF stage.

As a conventional filter in the RF stage of mobile communication device, a surface acoustic wave filter is widely used. Especially, a longitudinally coupled mode surface acoustic wave filter element allows a balanced-unbalanced conversion to be easily realized.

Furthermore, with regard to miniaturization, a face down mounting technology represented by flip chip and CSP (Chip Size Package) is becoming the mainstream instead of a conventional wire bonding mounting technology.

A longitudinally coupled mode surface acoustic wave filter element having conventional balanced type input/output terminals will be explained below.

FIG. 7 shows a configuration of a longitudinally coupled mode surface acoustic wave filter element having conventional balanced type input/output terminals.

In FIG. 7, the surface acoustic wave filter element is constructed of a first, second and third inter-digital transducer electrodes (hereinafter referred to as "IDT electrodes") 702, 703 and 704 and a first and second reflector electrodes 705 and 706 on a piezoelectric substrate 701. The electrode finger on one side of the first IDT electrode 702 is connected to one balanced type terminal 707 and the electrode finger on the other side of the first IDT electrode 702 is connected to another balanced type terminal 708.

Furthermore, the electrode fingers on one side of the second and third IDT electrodes 703 and 704 are connected to an unbalanced type terminal 709 and the electrode fingers on the other side are grounded. The above-described configuration allows a surface acoustic wave filter element provided with unbalanced-balanced type terminals to be realized.

Then, an example of a configuration where the surface acoustic wave filter element is mounted face down on a circuit board will be explained. FIG. 8A is a schematic view of a configuration of the surface acoustic wave filter element in FIG. 7 on the piezoelectric substrate.

The electrode finger on one side of the first IDT electrode 702 is connected to a first electrode pad 802 through a first wiring electrode 801. The electrode finger on the other side of the first IDT electrode 702 is connected to a second electrode pad 804 through a second wiring electrode 803.

The electrode finger on one side of the second IDT electrode 703 and the electrode finger on one side of the third IDT electrode 704 are each connected to a third electrode pad 806 through a third wiring electrode 805. The grounding electrode is omitted here.

FIG. 8B illustrates a surface layer of the circuit board on which the aforementioned surface acoustic wave filter element is mounted. A circuit board 807 is provided with a first on-circuit-board wiring electrode 808, a second on-circuit-board wiring electrode 809 and a third on-circuit-board wiring electrode 810.

The surface acoustic wave filter element shown in FIG. 8A is mounted in such a way as to face the circuit board 807. For example, a mounting method by ultrasonic thermo-compression bonding using a gold bump can be used. At this time, the first electrode pad 802 is connected to the first on-circuit-board wiring electrode 808, the second electrode pad 804 is connected to the second on-circuit-board wiring electrode 809 and the third electrode pad 806 is connected to the third on-circuit-board wiring electrode 810.

The first, second and third on-circuit-board wiring electrodes 808, 809 and 810 are led out as terminals by means of through holes, via holes or external electrodes of the circuit board, etc. In this case, the first, second and third electrodes 808, 809 and 810 are connected to one side OUT1 of the balanced type output terminal, the other side OUT2 of the balanced type output terminal and unbalanced type input terminal IN respectively, thus realizing a surface acoustic wave filter provided with the unbalanced-balanced type terminals.

Furthermore, the conventional surface acoustic wave device provides a plurality of grounding connecting conductors for connecting at least one of the grounding electrode pads of the surface acoustic wave element and at least one of grounding external connection terminals of the surface mounting package on the inner surface of the surface mounting package, and thereby improves the level of out-of-band suppression (e.g., see Japanese Patent Application Laid-Open No. 11-145772).

Furthermore, according to the conventional surface acoustic wave device, if coupling between the input terminals on the unbalanced type and the balanced type IDT terminals exists, an in-phase voltage is generated, and therefore it is recommended to suppress electrical coupling between both IDTs wherever possible, but no specific configuration thereof is disclosed (e.g., see "Transactions in 2001 on Foundation/Boundary Society Conference of Institute of Electronics, Information and Communication Engineers" (Institute of Electronics, Information and Communication Engineers, Aug. 29, 2001, pp. 283 to 284)).

The entire disclosure of Laid-open No. 11-145772 and pp. 283 to 284 are incorporated herein by reference in their entirety.

However, the aforementioned surface acoustic wave filter element or surface acoustic wave filter does not deal with causes for deterioration of a balance characteristic which is one of important electric characteristics in great detail nor defines a configuration of wiring electrodes on a piezoelectric substrate and a structure of a circuit board with the balance characteristic taken into consideration.

SUMMARY OF THE INVENTION

In view of the above-described problems of the conventional art, it is an object of the present invention to provide a surface acoustic wave filter element having a balanced type terminal, surface acoustic wave filter, module and communication device provided with a satisfactory balance characteristic by identifying causes for deterioration of a balance characteristic of a surface acoustic wave filter element or a surface acoustic wave filter and improving the balance characteristic.

One aspect of the present invention is a surface acoustic wave filter element comprising:

The 1st invention of the present invention is a surface acoustic wave filter element comprising:

a piezoelectric substrate; and a plurality of inter-digital transducer (IDT) electrodes formed on said piezoelectric substrate, wherein at least one of said plurality of IDT electrodes is connected to a balanced type terminal and other IDT electrodes are connected to balanced type terminals or unbalanced type terminals, and first wiring electrode means which is connected or to be connected to said at least one IDT electrode and second wiring electrode means which is connected or to be connected to said other IDT electrodes are disposed on planes different from each other.

Another aspect of the present invention is the surface acoustic wave filter element, wherein one of said first and second wiring electrode means is disposed on said piezoelectric substrate and said other wiring electrode means is disposed on a circuit board on which said piezoelectric substrate is to be mounted.

The 2nd invention of the present invention is the surface acoustic wave filter element according to the 1st invention, wherein one of said first and second wiring electrode means is disposed on said piezoelectric substrate and said other wiring electrode means is disposed on a circuit board on which said piezoelectric substrate is to be mounted.

Still another aspect of the present invention is the surface acoustic wave filter element, wherein (1) one of said first and second wiring electrode means is formed on said piezoelectric substrate and said other wiring electrode means is an inner layer electrode of a circuit board on which said piezoelectric substrate is to be mounted or (2) one of said first and second wiring electrode means is formed on a circuit board on which said piezoelectric substrate is to be mounted and said other wiring electrode means is an inner layer electrode of said circuit board.

The 3rd invention of the present invention is the surface acoustic wave filter element according to the 1st invention, wherein (1) one of said first and second wiring electrode means is formed on said piezoelectric substrate and said other wiring electrode means is an inner layer electrode of a circuit board on which said piezoelectric substrate is to be mounted or (2) one of said first and second wiring electrode means is formed on a circuit board on which said piezoelectric substrate is to be mounted and said other wiring electrode means is an inner layer electrode of said circuit board.

Yet still another aspect of the present invention is the surface acoustic wave filter element, wherein one of said first and second wiring electrode means is disposed on main plane of the piezoelectric substrate and said other wiring electrode means is disposed on a protective film formed on said main plane of said piezoelectric substrate.

The 4th invention of the present invention is the surface acoustic wave filter element according to the 1st invention, wherein one of said first and second, wiring electrode means is disposed on main plane of the piezoelectric substrate and said other wiring electrode means is disposed on a protective film formed on said main plane of said piezoelectric substrate.

Still yet another aspect of the present invention is the surface acoustic wave filter element, wherein said protective film is a dielectric thin film.

The 5th invention of the present invention is the surface acoustic wave filter element according to the 4th invention, wherein said protective film is a dielectric thin film.

A further aspect of the present invention is the surface acoustic wave filter element, wherein said surface acoustic wave filter element is a longitudinally coupled mode surface acoustic wave filter element, in which a first, second and third IDT electrodes and at least two reflector electrodes are disposed in the propagation direction of surface acoustic waves, and The 6th invention of the present invention is the surface acoustic wave filter element according to the 1st invention, wherein said surface acoustic wave filter element is a longitudinally coupled mode surface acoustic wave filter element, in which a first, second and third IDT electrodes and at least two reflector electrodes are disposed in the propagation direction of surface acoustic waves, and said second and third IDT electrodes are disposed on both sides of said first IDT electrode.

A still further aspect of the present invention is the surface acoustic wave filter element, further comprising:

The 7th invention of the present invention is the surface acoustic wave filter element according to the 6th invention, further comprising:

first and second electrode pads provided on said piezoelectric substrate;

a third electrode pad provided on said piezoelectric substrate and substantially directly connected to said second IDT electrode; and a fourth electrode pad provided on said piezoelectric substrate and directly connected to said third IDT electrode, wherein (1) said first wiring electrode means is provided on said piezoelectric substrate as a pair of wiring electrodes and (2) said first IDT electrode is of a balanced type and connected to said first and second electrode pads through the respective wiring electrodes of said pair of wiring electrodes, said second wiring electrode means is provided on said circuit board, and said surface acoustic wave filter element is mounted on said circuit board and said third and fourth electrode pads are thereby connected to said second wiring electrode means.

A yet further aspect of the present invention is the surface acoustic wave filter element, further comprising:

The 8th invention of the present invention is the surface acoustic wave filter element according to the 6th invention, further comprising:

first and second electrode pads practically directly connected to said first IDT electrode provided on said piezoelectric substrate and; and a third electrode pad provided on said piezoelectric substrate, wherein (1) said second wiring electrode means is disposed on said piezoelectric substrate and (2) said second and third IDT electrodes are of an unbalanced type and connected to said third electrode pad through said second wiring electrode means, said first wiring electrode means is disposed on said circuit board, and said surface acoustic wave filter element is mounted on said circuit board and said first and second electrode pads are thereby connected to said first wiring electrode means.

A still yet further aspect of the present invention is the surface acoustic wave filter element, wherein said third electrode pad is connected to one electrode finger of said second IDT electrode and said fourth electrode pad is connected to the other electrode finger of said third IDT electrode, and The 9th invention of the present invention is the surface acoustic wave filter element according to the 7th invention, wherein said third electrode pad is connected to one electrode finger of said second IDT electrode and said fourth electrode pad is connected to the other electrode finger of said third IDT electrode, and said other electrode finger is disposed on the opposite side viewed from said one electrode finger.

An additional aspect of the present invention is the surface acoustic wave filter element, wherein said second wiring electrode means is connected to one electrode finger of said second IDT electrode and also connected to the other electrode finger of said third IDT electrode, and The 10th invention of the present invention is the surface acoustic wave filter element according to the 8th invention, wherein said second wiring electrode means is connected to one electrode finger of said second IDT electrode and also connected to the other electrode finger of said third IDT electrode, and said other electrode finger is disposed on the opposite side viewed from said one electrode finger.

A still additional aspect of the present invention is the surface acoustic wave filter element, wherein said surface acoustic wave filter element is constructed in such a way that a first IDT electrode and a surface acoustic wave resonator made up of two reflector electrodes disposed on both sides of said first IDT electrode are connected in a ladder form or symmetric lattice form.

The 11th invention of the present invention is the surface acoustic wave filter element according to the 1st invention, wherein said surface acoustic wave filter element is constructed in such a way that a first IDT electrode and a surface acoustic wave resonator made up of two reflector electrodes disposed on both sides of said first IDT electrode are connected in a ladder form or symmetric lattice form.

A yet additional aspect of the present invention is a surface acoustic wave filter comprising:

a surface acoustic wave filter element; and

The 12th invention of the present invention is a surface acoustic wave filter comprising:

a surface acoustic wave filter element according to any one of the 1st to 11th inventions; and a circuit board on which said surface acoustic wave filter element is mounted.

A still yet additional aspect of the present invention is the surface acoustic wave filter, wherein said circuit board constitutes part of a ceramic package.

The 13th invention of the present invention is the surface acoustic wave filter according to the 12th invention, wherein said circuit board constitutes part of a ceramic package.

A supplementary aspect of the present invention is the surface acoustic wave filter, The 14th invention of the present invention is the surface acoustic wave filter according to the 12th invention, wherein said circuit board is a laminated element made of a dielectric, said surface acoustic wave filter element is mounted on said laminated element, and said wiring electrode means is disposed on the top surface of said laminated element or in an inner layer of said laminated element.

A still supplementary aspect of the present invention is the surface acoustic wave filter, The 15th invention of the present invention is the surface acoustic wave filter according to the 12th invention, wherein said IDT electrodes and the wiring electrodes formed on said circuit board are disposed in such a way that those electrodes do not spatially overlap with one another.

A yet supplementary aspect of the present invention is the surface acoustic wave filter, wherein said mounting is face down mounting.

The 16th invention of the present invention is the surface acoustic wave filter according to the 12th invention, wherein said mounting is face down mounting.

A still yet supplementary aspect of the present invention is the surface acoustic wave filter element, wherein there is free space between said different planes.

The 17th invention of the present invention is the surface acoustic wave filter element according to the 1st invention, wherein there is free space between said different planes.

Another aspect of the present invention is the surface acoustic wave filter element, wherein when it is assumed that a relative dielectric constant between said different planes is $\in$; a distance between said first and second wiring electrode means formed on said different planes is t; an area of the intersection formed by said first wiring electrode means and said second wiring electrode means is S, then The 18th invention of the present invention is the surface acoustic wave filter element according to the 1st invention, wherein when it is assumed that a relative dielectric constant between said different planes is $\in$; a distance between said first and second wiring electrode means formed on said different planes is t; an area of the intersection formed by said first wiring electrode means and said second wiring electrode means is S, then $$\in \times S/t \leq 1.1 \times 10^{-2}$$

is satisfied.

Still another aspect of the present invention is the surface acoustic wave filter element, wherein said piezoelectric substrate is a substrate whose effective relative dielectric constant is 40 or above.

The 19th invention of the present invention is the surface acoustic wave filter element according to the 1st invention, wherein said piezoelectric substrate is a substrate whose effective relative dielectric constant is 40 or above.

Yet still another aspect of the present invention is the surface acoustic wave filter element, wherein the material of said piezoelectric substrate is selected from lithium tantalite and lithium niobate.

The 20th invention of the present invention is the surface acoustic wave filter element according to the 19th invention, wherein the material of said piezoelectric substrate is selected from lithium tantalite and lithium niobate.

Still yet another aspect of the present invention is the surface acoustic wave filter element, wherein said surface acoustic wave filter element is constructed in such a way that the value of admittance of parasitic components between said first wiring electrode means and said second wiring electrode means is 0.6 mS or less.

The 21st invention of the present invention is the surface acoustic wave filter element according to the 1st invention, wherein said surface acoustic wave filter element is constructed in such a way that the value of admittance of parasitic components between said first wiring electrode means and said second wiring electrode means is 0.6 mS or less.

A further aspect of the present invention is a module comprising:
a surface acoustic wave filter element;
The 22nd invention of the present invention is a module comprising:
a surface acoustic wave filter element according to any one of the 1st to 11th or 17th to 21st inventions;
a predetermined semiconductor device; and
a substrate on which said surface acoustic wave filter element and said semiconductor device are mounted.

A still further aspect of the present invention is the module, wherein said substrate is a laminated element made up of laminated dielectric layers.

The 23rd invention of the present invention is the module according to the 22nd invention, wherein said substrate is a laminated element made up of laminated dielectric layers.

A yet further aspect of the present invention is the module, wherein said semiconductor device is a low-noise amplifier.

The 24th invention of the present invention is the module according to the 22nd invention, wherein said semiconductor device is a low-noise amplifier.

A still yet further aspect of the present invention is the module, wherein said low-noise amplifier is of a balanced type.

The 25th invention of the present invention is the module according to the 24th invention, wherein said low-noise amplifier is of a balanced type.

An additional aspect of the present invention is the module, wherein said semiconductor device is either a switch element or mixer.

The 26th invention of the present invention is the module according to the 24th invention, wherein said semiconductor device is either a switch element or mixer.

A still additional aspect of the present invention is a surface acoustic wave filter comprising:

The 27th invention of the present invention is a surface acoustic wave filter comprising:
a surface acoustic wave filter element provided with (1) a piezoelectric substrate and (2) a plurality of inter-digital transducer electrodes (IDT electrodes) formed on said piezoelectric substrate;
a circuit board on which said surface acoustic wave filter element is mounted;
first wiring electrode means of connecting at least one of said plurality of IDT electrodes to a balanced type terminal disposed on said circuit board; and
second wiring electrode means of connecting other IDT electrodes of said plurality of IDT electrodes to a balanced type terminal or unbalanced type terminal disposed on said circuit board,
wherein said first wiring electrode means and said second wiring electrode means are disposed on different planes.

A yet additional aspect of the present invention is a communication device comprising:

The 28th invention of the present invention is a communication device comprising:
an antenna;
switch means connected to said antenna;
a transmission filter provided between said switch means and a transmission circuit; and
a reception filter provided between said switch means and a reception circuit,
wherein said transmission filter and/or said reception filter include a surface acoustic wave filter element.
wherein said transmission filter and/or said reception filter include a surface acoustic wave filter element according to any one of the 1st to 11th, 17th to 21st or 27th inventions.

BRIEF DESCRIPTION OF THE DRAWINGS

FIG. 8A is a schematic view of a configuration of a conventional surface acoustic wave filter element;

FIG. 8B illustrates a surface layer of a conventional circuit board;

DESCRIPTION OF SYMBOLS

Figure 1:
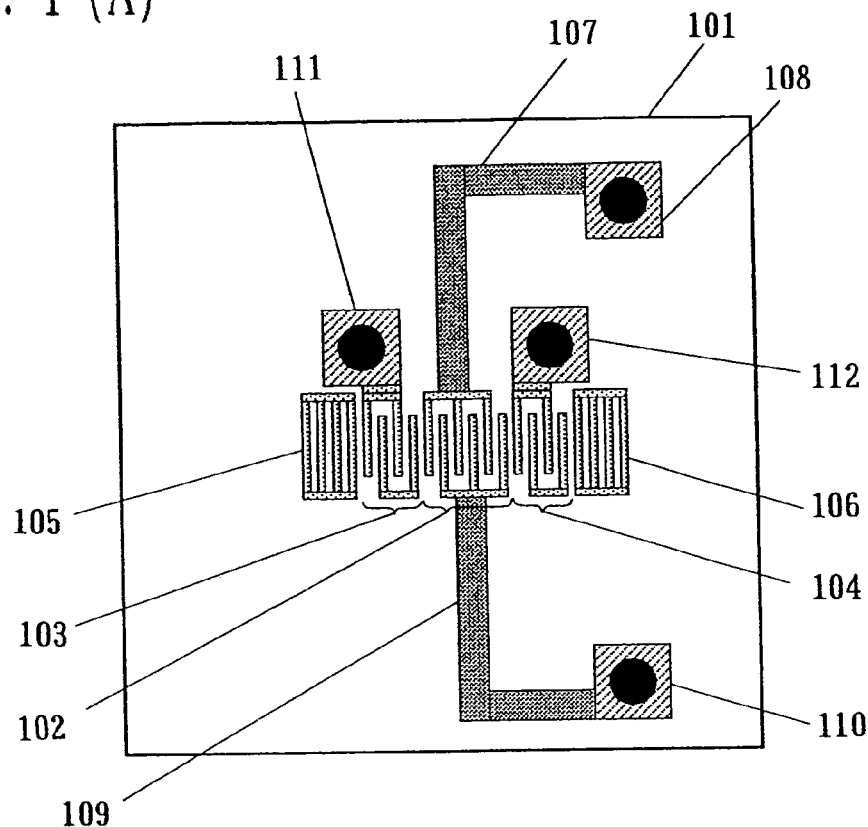
FIG. 1A is a schematic view of a configuration of a surface acoustic wave filter element according to Embodiment 1 of the present invention.
FIG. 1B illustrates a surface layer of a circuit board according to Embodiment 1 of the present invention.
Figure 1:
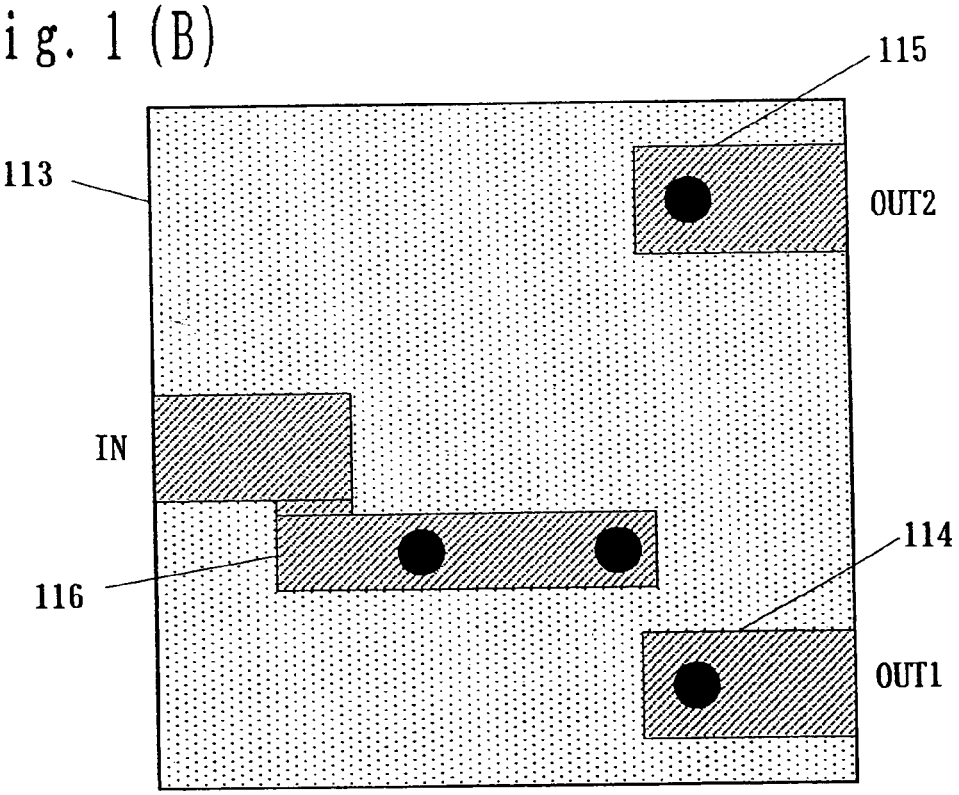

101 Piezoelectric substrate
102 First IDT electrode
103 Second IDT electrode
104 Third IDT electrode
105 First reflector electrode
106 Second reflector electrode.
107 First wiring electrode
108 First electrode pad
109 Second wiring electrode
110 Second electrode pad
111 Third electrode pad
112 Fourth electrode pad
113 Circuit board
114 First on-circuit-board wiring electrode
115 Second on-circuit-board wiring electrode
116 Third on-circuit-board wiring electrode
301 Wiring electrode
302 Electrode pad
303 First on-circuit-board wiring electrode
304 Second on-circuit-board wiring electrode
305 Third on-circuit-board wiring electrode
401 Piezoelectric substrate
402 First IDT electrode
403 Second IDT electrode
404 Third IDT electrode
405 First reflector electrode
406 Second reflector electrode
407 One balanced type terminal
408 Other balanced type terminal
409 Unbalanced type terminal
410 Surface acoustic wave resonator
501 First wiring electrode
502 First electrode pad
503 Second wiring electrode
504 Second electrode pad
505 Third electrode pad
506 Fourth electrode pad
507 Fifth electrode pad
508 Sixth electrode pad
509 Circuit board
510 First on-circuit-board wiring electrode
511 Second on-circuit-board wiring electrode
512 Third on-circuit-board wiring electrode
513 Fourth on-circuit-board wiring electrode
601 IDT electrode
602 On-circuit-board wiring electrode
603 On-circuit-board wiring electrode
604 Parasitic component
701 Piezoelectric substrate
702 First IDT electrode
703 Second IDT electrode
704 Third IDT electrode
705 First reflector electrode
706 Second reflector electrode
707 One balanced type terminal
708 Other balanced type terminal
709 Unbalanced type terminal
801 First wiring electrode
802 First electrode pad
803 Second wiring electrode
804 Second electrode pad
805 Third wiring electrode
806 Third electrode pad
807 Circuit board
808 First on-circuit-board wiring electrode
809 Second on-circuit-board wiring electrode
810 Third on-circuit-board wiring electrode
1001 Capacitance component

DETAILED DESCRIPTION OF THE PREFERRED EMBODIMENTS

EMBODIMENT 1

With reference now to the attached drawings, a surface acoustic wave filter element and surface acoustic wave filter according to Embodiment 1 of the present invention will be explained below.

Figure 9:
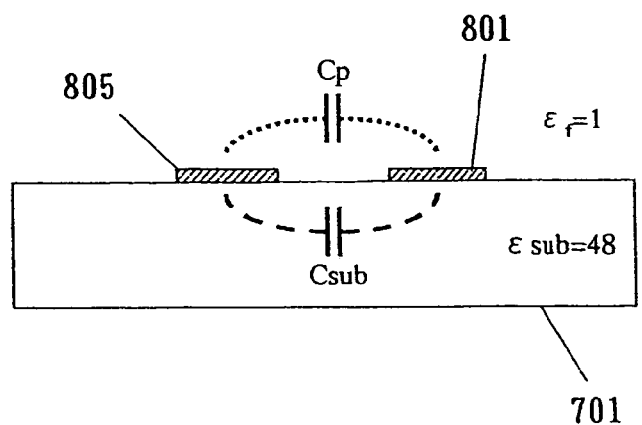
FIG. 9 is a cross-sectional view at A–A' in FIG. 8A.

First, causes for deterioration of the balance characteristic of the aforementioned surface acoustic wave filter element will be considered. FIG. 9 shows a cross-sectional view at A–A' of the surface acoustic wave filter in FIG. 8A. For such a surface acoustic wave, a piezoelectric substrate made of lithium tantalite ($LiTaO_3$) and lithium niobate ($LiNbO_3$), etc. are widely used and the effective relative dielectric constants of these substrates are relatively as large as approximately 48 and 49 respectively Here, the effective relative dielectric constant is defined by the following Equation 1.

$$\sqrt{\{(\epsilon_{11}^T) \times (\epsilon_{33}^T)\}} \qquad \text{(Equation 1)}$$

where $\epsilon_{11}^T$ and $\epsilon_{33}^T$ are relative dielectric constant tensors of the piezoelectric substrate.

As shown in FIG. 9, a parasitic component Csub through the medium of the substrate and a spatial parasitic component Cp, etc. occur between the first wiring electrode 801 and the third wiring electrode 805.

When wiring is conducted using the wiring electrodes on the piezoelectric substrate, the relative dielectric constant is large and its influence is large accordingly. On the other hand, if these electrodes are distanced from each other, the coupling by the parasitic components can be reduced, but in practice, the surface acoustic wave filter element must also be reduced in size, hence there is a limit to increasing the distance between these electrodes.

Figure 10:
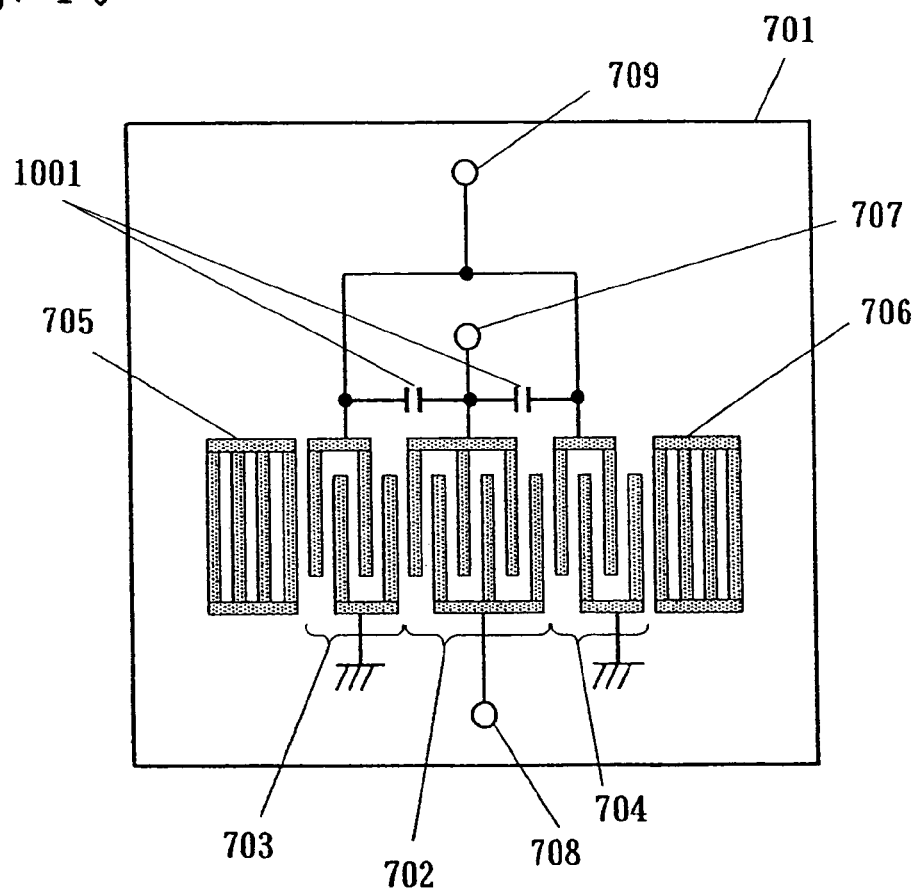
FIG. 10 is a schematic view of a configuration of a surface acoustic wave filter with parasitic components taken into consideration.

FIG. 10 shows a configuration with these parasitic components taken into consideration. For the parasitic component in the surface acoustic wave filter in FIG. 7, it is possible to assume a configuration with capacitance components 1001 inserted between input/output IDT electrodes. FIG. 11A and FIG. 11B show results of an analysis on a 900-MHz band filter when the capacitance value of capacitance components 1001 is changed in the configuration shown in FIG. 10.

FIG. 11A and FIG. 11B show an amplitude balance characteristic and phase balance characteristic respectively as indices indicating the balance characteristic.

Figure 7:
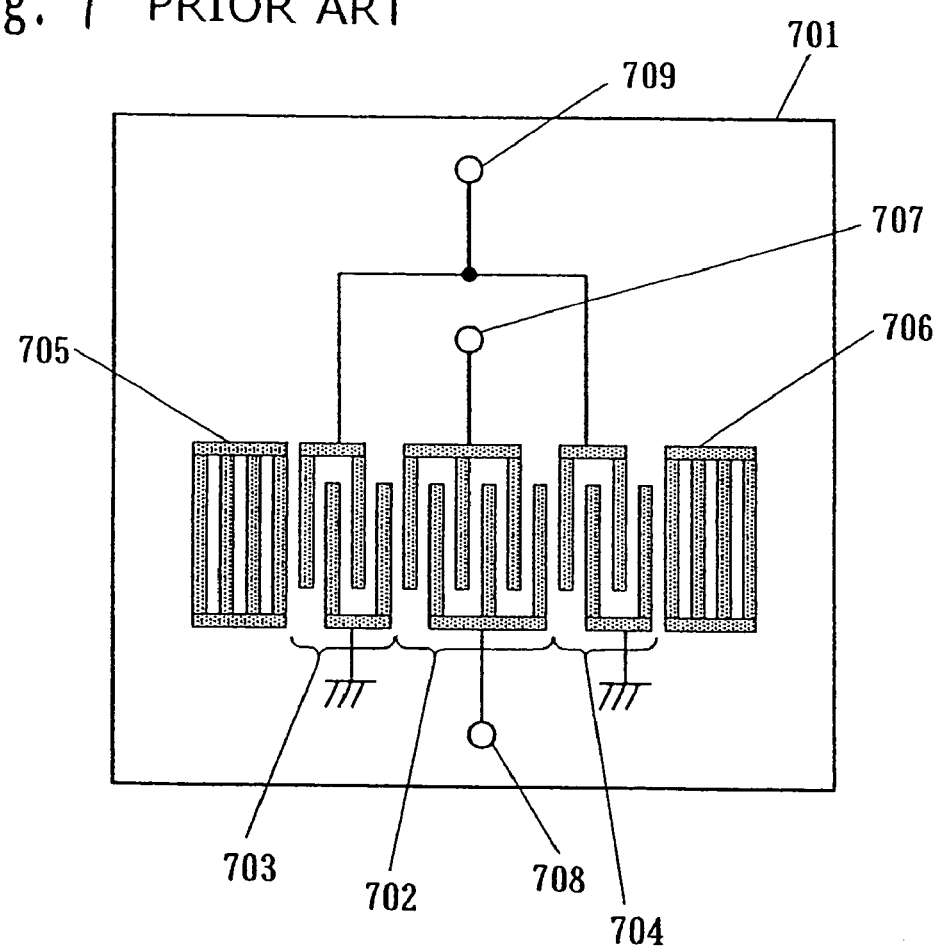
FIG. 7 is a block diagram schematically showing a conventional surface acoustic wave filter.

Here, the amplitude balance characteristic is as follows. That is, a signal input from the unbalanced type terminal 709 of the surface acoustic wave filter element shown in FIG. 7 or FIG. 10 is output to the balanced type terminal 707 on one side and the balanced type terminal 708 on the other side as a balanced signal. It is the amplitude balance characteristic that indicates an amplitude difference between the amplitude of the signal output to the balanced-type terminal 707 on one side and the amplitude of the signal output to the balanced type terminal 708 on the other side. Then, if this value becomes zero, it is possible to assume that there is no deterioration of the balance characteristic.

On the other hand, the phase balance characteristic indicates a deviation from 180 degrees of a phase difference between the phase of the signal output to the balanced type terminal 707 on one side and the phase of the signal output to the balanced type terminal 708 on the other side. Then, if this value becomes zero, it is possible to assume that there is no deterioration of the balance characteristic.

FIG. 11A and FIG. 11B indicate maximum values and minimum values of amplitude and phase balance characteristics respectively in the pass bands. FIG. 11A shows the amplitude balance characteristic and FIG. 11B shows the phase balance characteristic.

As shown in FIG. 11A and FIG. 11B, the balance characteristic deteriorates as the capacitance value increases. That is, the greater the coupling between input and output due to the parasitic components, the greater the deterioration of the balance characteristic.

Realizing a filter capable of keeping the amplitude balance characteristic within ±1 dB and the phase balance characteristic within ±10 deg requires the capacitance value as the parasitic components between input and output to be reduced to 0.10 pF or less. That is, considering an admittance component Y, $Y=2\pi fC$, and therefore Y can be set to 0.6 [mS] or less, where f is a frequency and C is a capacitance value.

Then, the configurations of the surface acoustic wave filter element and surface acoustic wave filter capable of overcoming the aforementioned causes for deterioration of the balance characteristics will be explained.

FIG. 1A is a schematic view of a configuration of a surface acoustic wave filter element on a piezoelectric substrate. The electrode finger on one side of the first IDT electrode 102 is connected to the first electrode pad 108 through the first wiring electrode 107.

The electrode finger on the other side of the first IDT electrode 102 is connected to the second electrode pad 110 through the second wiring electrode 109.

The electrode fingers on one side of the second and third IDT electrodes 103 and 104 are practically directly connected to the third and fourth electrode pads 111 and 112. The electrode fingers on the other side of the second and third IDT electrodes 103 and 104 are grounded, but the grounding electrodes are omitted here.

FIG. 1B illustrates a surface layer of the circuit board on which the aforementioned surface acoustic wave filter element is mounted. The circuit board 113 is provided with a first, second and third on-circuit-board wiring electrodes 114, 115 and 116.

Figure 12:
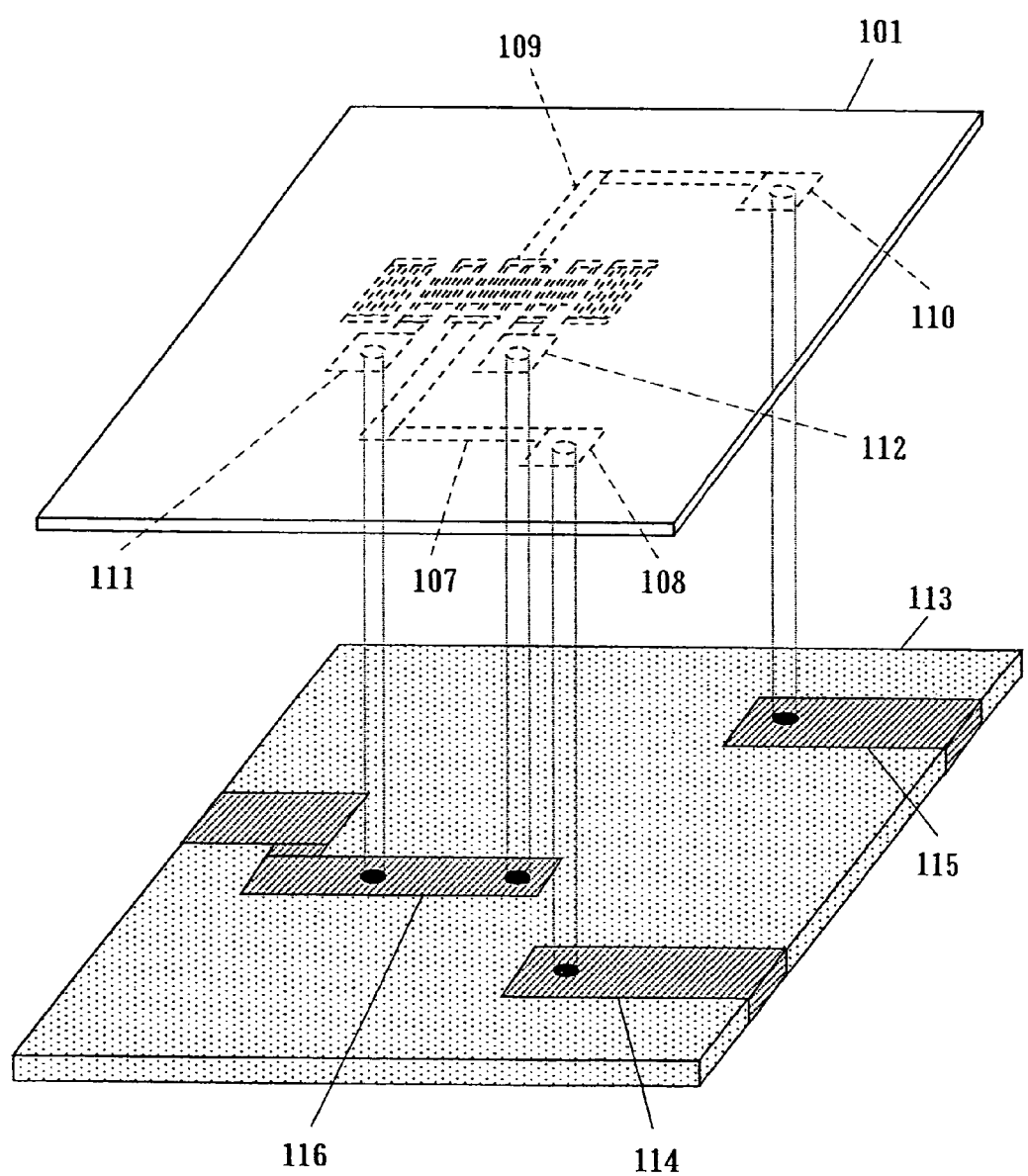
FIG. 12 is an exploded perspective view of the surface acoustic wave filter according to Embodiment 1 of the present invention.

The surface acoustic wave filter element shown in FIG. 1A is mounted in such a way as to face the circuit board 113 (see FIG. 12). Here, FIG. 12 is an exploded perspective view of the surface acoustic wave filter mounted in such a way that the surface acoustic wave filter element faces the circuit board 113.

For example, a mounting method by ultrasonic thermocompression bonding using a gold bump can be used.

At this time, the first electrode pad 108 is connected to the first on-circuit-board wiring electrode 114, the second electrode pad 110 is connected to the second on-circuit-board wiring electrode 115 and the third and fourth electrode pads 111 and 112 are connected to two locations of the third on-circuit-board wiring electrode 116.

At this time, the third wiring electrode 116 on the circuit board plays the same role as that of the third wiring electrode 805 in FIG. 8A, that is, plays a role as a wiring electrode for electrically connecting the third electrode pad 111 and the fourth electrode pad 112.

The first, second and third on-circuit-board wiring electrodes 114, 115 and 116 are led out as terminals by means of through holes, via holes or external electrodes of the circuit board, etc.

In this case, the first, second and third electrodes 114, 115 and 116 are connected to one side OUT1 of the balanced type output terminal, the other side OUT2 of the balanced type output terminal and unbalanced type input terminal IN, realizing a surface acoustic wave filter provided with the unbalanced-balanced type terminals.

Adopting such a configuration, the first and second wiring electrodes 107 and 109 of the first IDT electrode are spatially distanced from the wiring electrode 116 on the third circuit board connected to the second and third IDT electrodes.

Such a configuration can obviously suppress coupling between input and output to a minimum compared to the configuration shown in FIG. 8A and improve the balance characteristic of the surface acoustic wave filter element.

By the way, the first wiring electrode means of the present invention corresponds to the pair of wiring electrodes denoted by the first and second wiring electrodes 107 and 109 in FIG. 1A. Furthermore, the second wiring electrode means of the present invention corresponds to the third on-circuit-board wiring electrode 116 shown in FIG. 1B.

Figure 2:
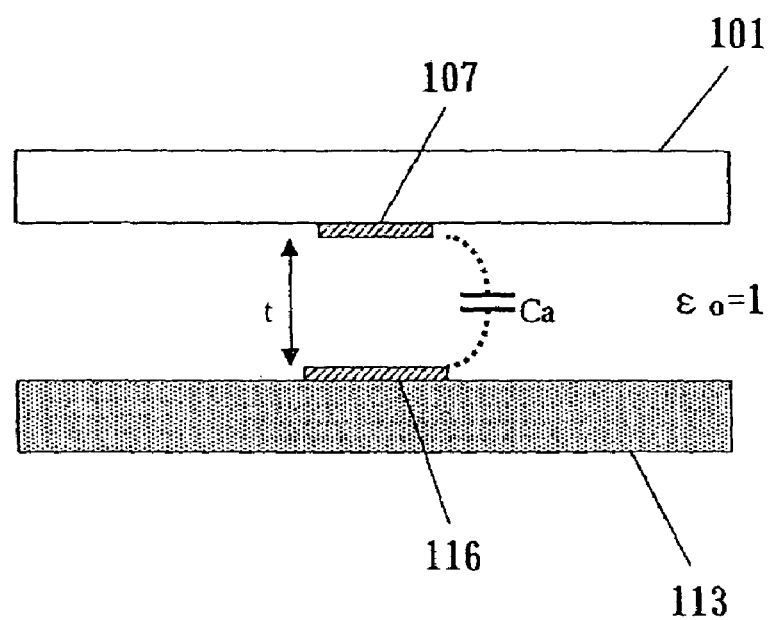
FIG. 2 is a side view schematically showing a positional relationship between wiring electrodes and on-circuit-board wiring electrodes on the circuit board according to Embodiment 1 of the present invention.

Furthermore, in FIG. 2, there is an area where the first wiring electrode 107 intersects with the third on-circuit-board wiring electrode 116 and a parasitic component Ca in this area is expressed by the following Equation 2 assuming that the intersection area is approximated as a parallel plate capacitor.

$$Ca = \epsilon_0 \times S/t \quad \text{(Equation 2)}$$

where $\epsilon_0$ is a dielectric constant in a free space, S is an area of the intersection and t is a distance between the electrodes.

For example, suppose S=100 μm×100 μm, t=20 μm. Then, from Equation 2, Ca is as small as 4.4 [fF].

In practice, it is necessary to optimize the configurations of the piezoelectric substrate and circuit board also considering elements other than the intersection area, but if both electrodes are spatially distant from each other, it is possible to reduce coupling between input and output compared to the conventional configuration and achieve the same effect of improving the balance characteristic.

Furthermore, when wiring is conducted by eliminating the wiring electrodes on the piezoelectric substrate of the surface acoustic wave filter element and using the circuit board as a multilayer substrate, the height of the overall filter including the substrate increases slightly, which may constitute a disadvantage from the standpoint of low-profile implementation, but with regard to the balance characteristic, effects of the improvement can be obtained if a substrate of a small relative dielectric constant is used.

Examples of the circuit board include a laminated element made of alumina and ceramic dielectric, etc. The relative dielectric constant of these substances is on the order of 10.

Figure 11:
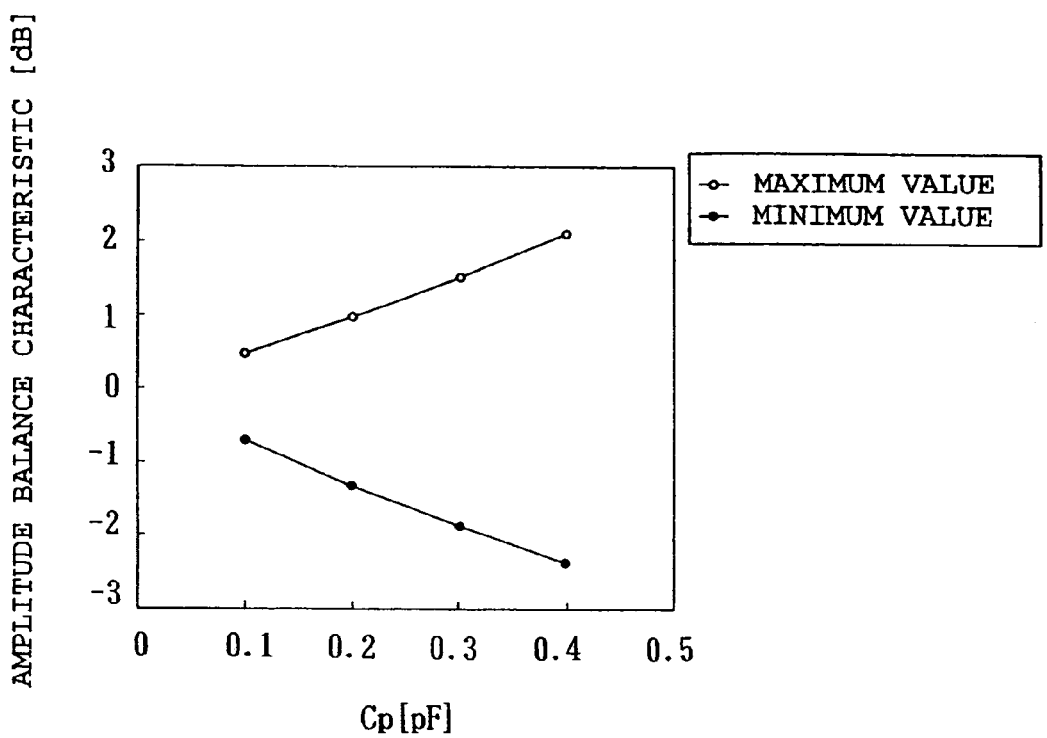
FIG. 11A shows an amplitude of a surface acoustic wave filter.
FIG. 11B shows a phase balance characteristic.
Figure 11:
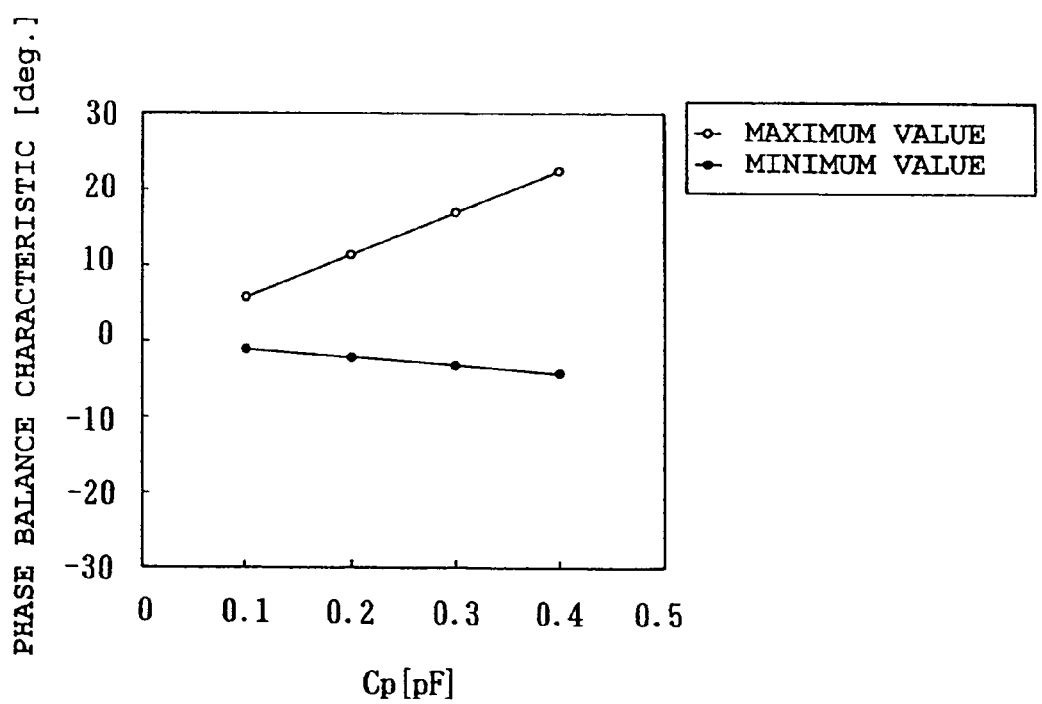

In this case, Ca becomes 0.04 [pF] according to the above-described Equation and it is known from FIG. 11 that deterioration of the balance characteristic is small.

Therefore, in order to conduct multilayer wiring in the circuit board to realize a configuration with the parasitic component reduced to 0.1 pF or less, it is preferable that the relative dielectric constant ∈ of the circuit board material, distance t between the wiring electrodes and the area S of the intersection of the wiring electrodes have a relationship that satisfies:

$$\in \times S/t \leq 1.1 \times 10^{-2} \quad \text{(Equation 3)}$$

However, when materials of a plurality of different relative dielectric constants exist between the planes, the planes as a whole need to satisfy the above relationship.

Figure 3:
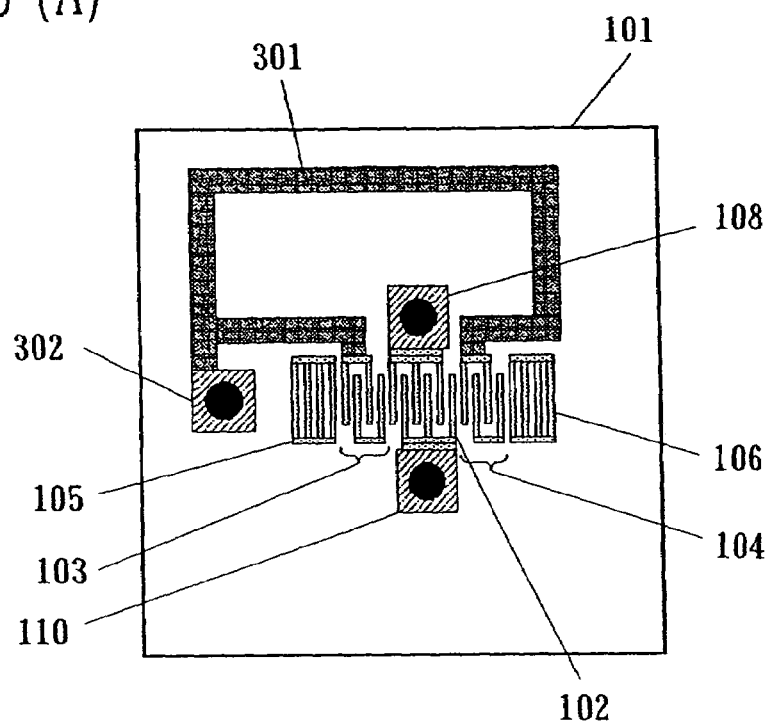
FIG. 3A is a schematic view of another configuration of the surface acoustic wave filter element according to Embodiment 1 of the present invention.
FIG. 3B illustrates another surface layer of the circuit board according to Embodiment 1 of the present invention.
Figure 3:
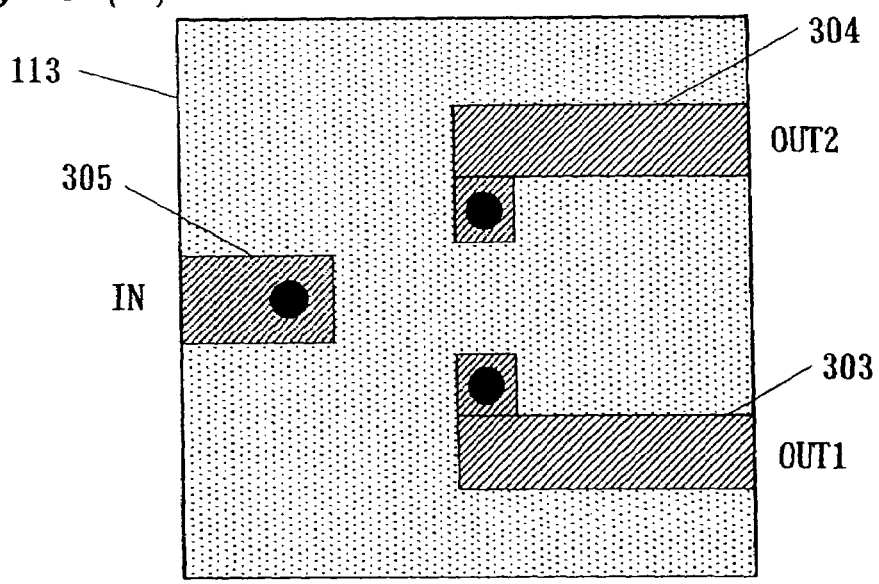

Furthermore, according to this embodiment, the wiring electrodes 107 and 109 on the balanced side are formed on the piezoelectric substrate 101 and those on the unbalanced side are practically directly connected to the wiring electrode 116 on the circuit board. However, this embodiment is not limited to this and, for example, as shown in FIG. 3, the second and third IDT electrodes 103 and 104 on the unbalanced side can also be connected to the electrode pad 302 through the wiring electrode 301 and the first and second electrode pads 108 and 110 can also be practically directly connected to the first IDT electrode 102.

At this time, the first and second electrode pads 108 and 110 are connected to the wiring electrodes 303 and 304 on the circuit board. Therefore, the wiring electrode 303 on the circuit board plays the same role (role as the wiring electrode) as that of the first wiring electrode 801 in FIG. 8A. Furthermore, the wiring electrode 304 on the circuit board plays the same role (role as the wiring electrode) as that of the second wiring electrode 803 in FIG. 8A.

Furthermore, the third electrode pad 302 is connected to the wiring electrode 305 on the circuit board. In this case, the on-circuit-board wiring electrodes 303, 304 and 305 on the circuit board on the surface layer of the circuit board 113 are arranged as appropriate according to the configuration of the surface acoustic wave on the piezoelectric substrate 101.

Even with the above configuration, the wiring electrodes 303 and 304 of the first IDT electrodes on the first and second circuit boards are spatially separated from the wiring electrode 301 of the second and third IDT electrodes, which makes it possible to reduce coupling between input and output to a minimum and improve the balance characteristic of the surface acoustic wave filter.

By the way, the first wiring electrode means of the present invention corresponds to the pair of the wiring electrodes denoted by the first and second on-circuit-board wiring electrodes 303 and 304 in FIG. 3B. Furthermore, the second wiring electrode means of the present invention corresponds to the wiring electrode 301 shown in FIG. 3A.

This embodiment has described a circuit board, but a package etc. can also be used.

Furthermore, this embodiment has described the configuration where the electrode fingers on one side of the second and third IDT electrodes 103 and 104 are practically directly connected to the third and fourth electrode pads 111 and 112, but this embodiment is not limited to this and, for example, the electrode fingers can also be connected through a bus bar electrode etc. if the configuration is at least optimized in such a configuration that shortens the wiring length.

EMBODIMENT 2

With reference now to the attached drawings, a surface acoustic wave filter element and surface acoustic wave filter according to Embodiment 2 of the present invention will be explained below.

Figure 4:
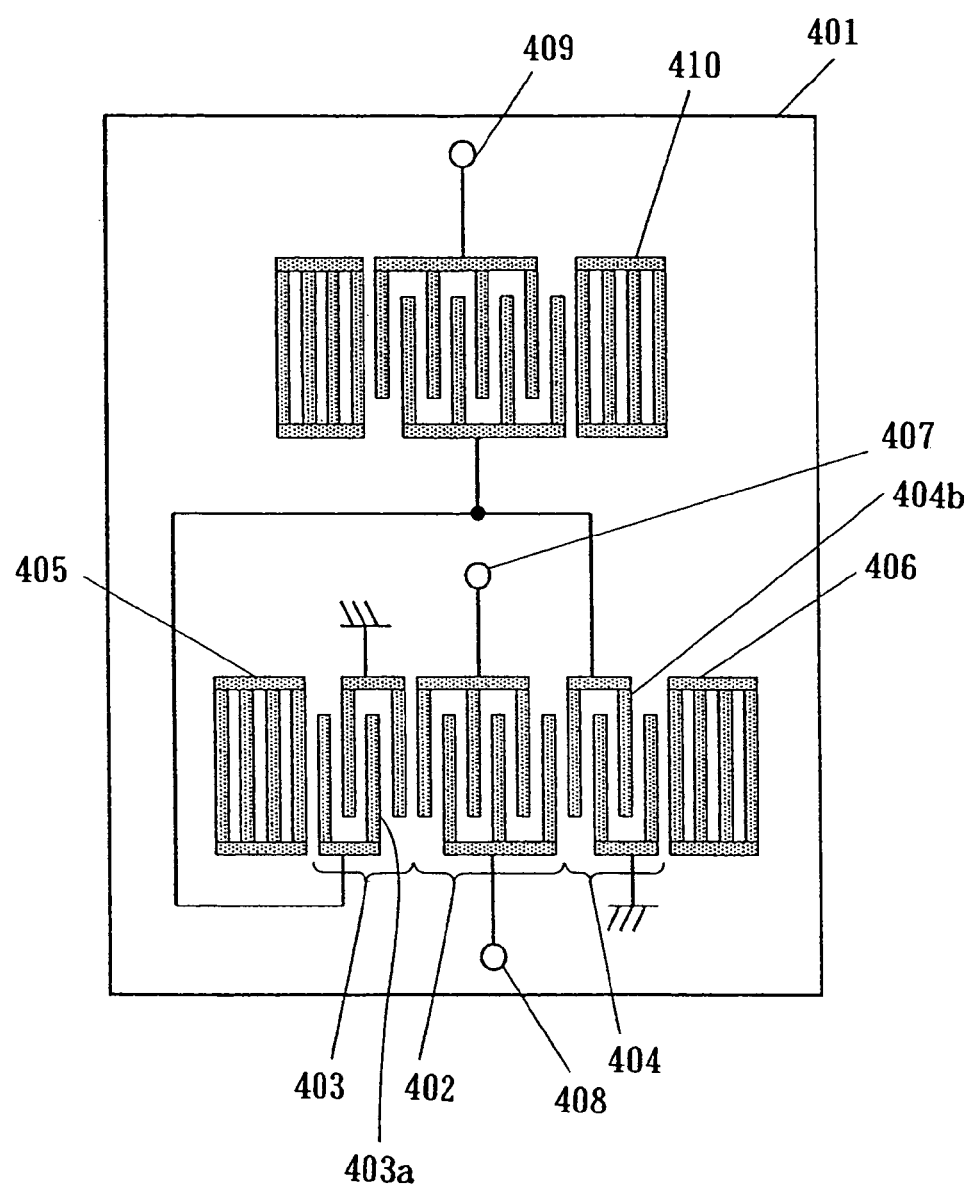
FIG. 4 is a schematic view of a configuration of a surface acoustic wave filter according to Embodiment 2 of the present invention.

In FIG. 4, the surface acoustic wave filter element is constructed of a first, second and third IDT electrodes 402, 403 and 404 and first and second reflector electrodes 405 and 406 and a surface acoustic wave resonator 410 made up of IDT electrodes and reflector electrodes on a piezoelectric substrate 401.

The electrode finger on one side of the first IDT electrode 402 is connected to one balanced type terminal 407 and the electrode finger on the other side of the first IDT electrode 402 is connected to another balanced type terminal 408.

Furthermore, an unbalanced type terminal 409 is connected to the electrode finger on one side of the second IDT electrode 403 and the electrode finger on the other side of the third IDT electrode 404 through the surface acoustic wave resonator 410.

Figure 5:
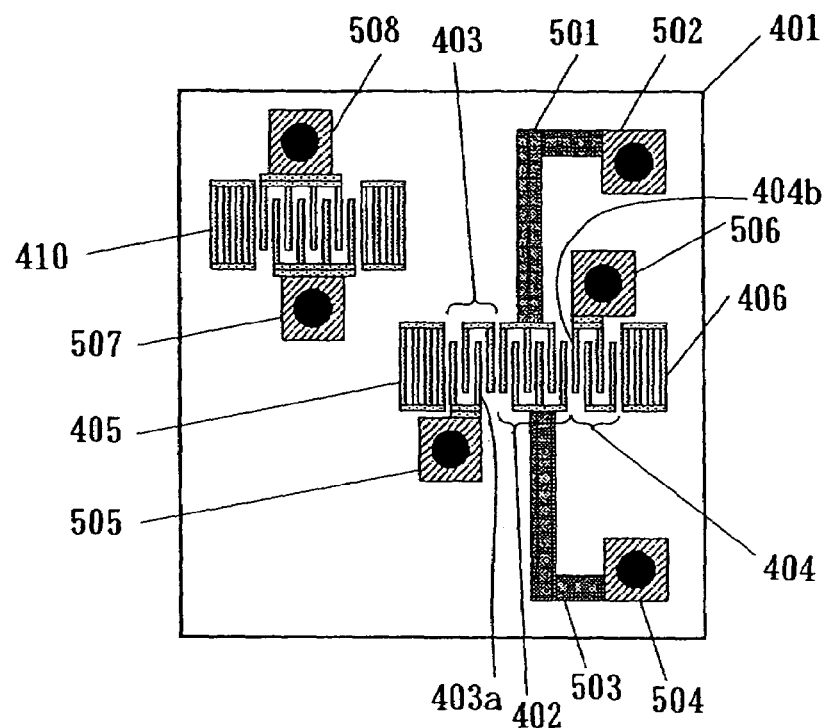
FIG. 5A is a schematic view of a configuration of a surface acoustic wave filter element according to Embodiment 2 of the present invention.
FIG. 5B illustrates a surface layer of a circuit board according to Embodiment 2 of the present invention.
Figure 5:
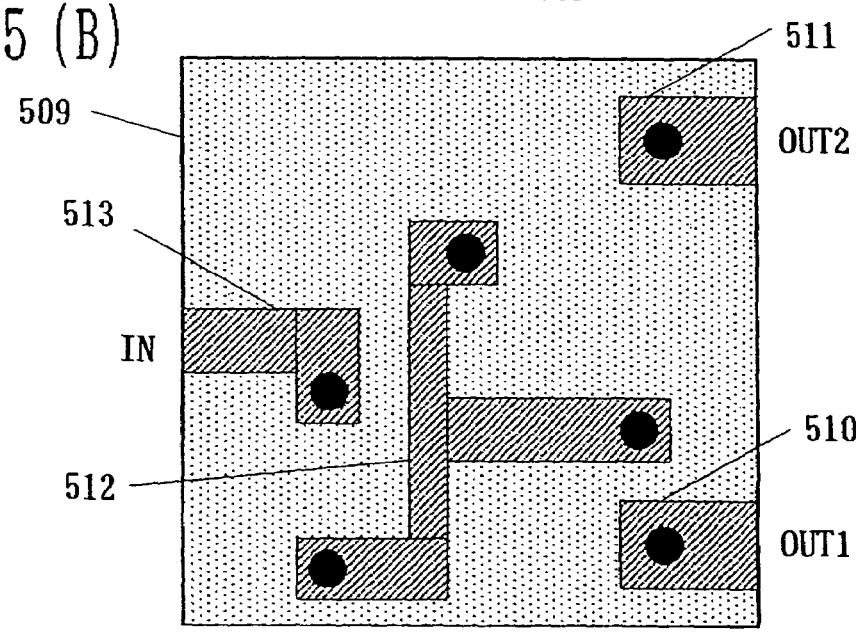

Here, the electrode finger 403a on one side of the second IDT electrode 403 and the electrode finger 404b on the other side of the third IDT electrode 404 are disposed opposite to each other as shown in FIG. 4 and FIG. 5.

Adopting such a configuration realizes a surface acoustic wave filter element having unbalanced-balanced type terminals.

Then, an example of a configuration when the surface acoustic wave filter element is mounted face down on a package and substrate will be explained. FIG. 5A is a schematic view of a configuration of the surface acoustic wave filter element on a piezoelectric substrate.

The electrode finger on one side of the first IDT electrode 402 is connected to a first electrode pad 502 through a first wiring electrode 501. The electrode finger on the other side of the first IDT electrode 402 is connected to a second electrode pad 504 through a second wiring electrode 503.

The electrode finger of the second IDT electrode 403 on one side is practically directly connected to the third electrode pad 505. The electrode finger on the other side of the third IDT electrode 404 is practically and directly connected to the fourth electrode pad 506.

The electrode finger on the other side of the second IDT electrode 403 and the electrode finger on one side of the third IDT electrode 404 are grounded, but the description of the grounding electrodes is omitted here.

Furthermore, the one side and the other side of the IDT electrode of the surface acoustic wave resonator 410 are practically directly connected to a fifth and sixth electrode pads 507 and 508.

FIG. 5B shows a surface layer of the circuit board on which the aforementioned surface acoustic wave filter element is mounted. The circuit board 509 is provided with a first, second, third and fourth on-circuit-board wiring electrodes 510, 511, 512 and 513.

The surface acoustic wave filter element shown in FIG. 5A is mounted in such a way as to face the circuit board 509.

For example, a mounting method by ultrasonic thermo-compression bonding using a gold bump can be used. At this time, the first electrode pad 502 is connected to the first on-circuit-board wiring electrode 510, the second electrode pad 504 is connected to the second on-circuit-board wiring electrode 511 and the third and fourth electrode pads 505 and 506 are connected to the third on-circuit-board wiring electrode 512.

Furthermore, the fifth electrode pad 507 is connected to the fourth on-circuit-board wiring electrode 513 and the sixth electrode pad 508 is connected to the third on-circuit-board wiring electrode 512.

That is, the third on-circuit-board wiring electrode 512 is connected to three electrode pads and plays a role of the wiring electrode for connecting the surface acoustic wave resonator 410 and the second and third IDT electrodes 403 and 404.

Furthermore, the first, second and fourth on-circuit-board wiring electrodes 510, 511 and 513 are led out as terminals by means of through holes, via holes or external electrodes of the circuit board, etc.

In this case, the first, second and fourth electrodes 510, 511 and 513 are connected to one side OUT1 of the balanced type output terminal, the other side OUT2 of the balanced type output terminal and unbalanced type input terminal IN, realizing a surface acoustic wave filter provided with the unbalanced-balanced type terminals.

Adopting such a configuration, the first and second wiring electrodes 501 and 503 of the first IDT electrodes are spatially separated from the third on-circuit-board wiring electrode 512 connected to the second and third IDT electrodes, which can suppress coupling between input and output to a minimum and improve the balance characteristic of the surface acoustic wave filter element.

Actual measurement results of the filter of the present invention were compared with those of the filter of the conventional configuration and the balance characteristic was evaluated using a 1.8-GHz band filter, and the results show that by adopting the configuration of the present invention, deviations of the amplitude and phase balance characteristics (difference between maximum and minimum values) are improved by about 25%.

Further adopting such a configuration that the wiring electrodes on the circuit board and the IDT electrodes formed on the piezoelectric substrate do not spatially overlap with one another makes it possible to further reduce parasitic components.

Figure 6:
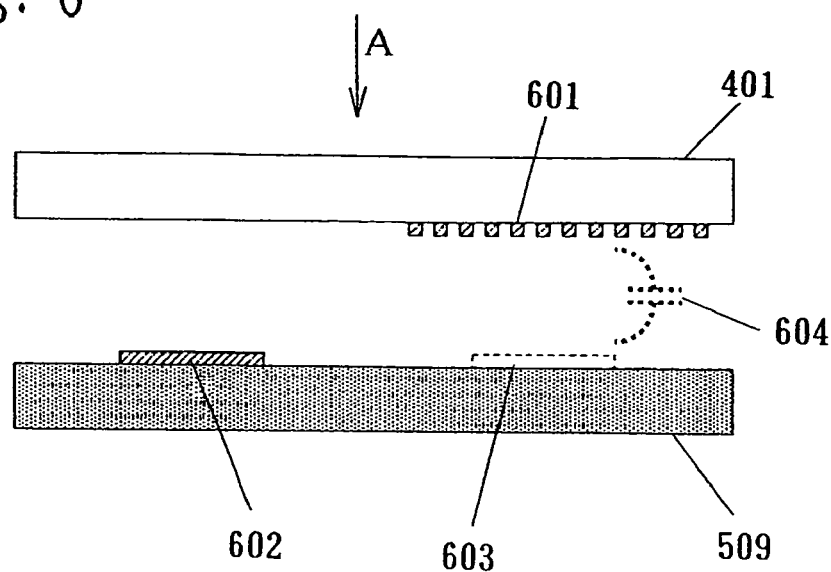
FIG. 6 is a side view schematically showing a positional relationship between IDT electrodes and on-circuit-board wiring electrodes on the circuit board according to Embodiment 2 of the present invention.

That is, when the piezoelectric substrate 401 is viewed in the direction indicated by arrow A in FIG. 6, it is effective to adopt a configuration that will prevent the IDT electrode 601 from overlapping with the wiring electrode 602 on the circuit board as shown in FIG. 6. If anon-circuit-board wiring electrode is provided on the area 603 shown with a broken line in FIG. 6, a parasitic component 604 is generated between the IDT electrodes and that area, which may cause deterioration of the electric characteristic.

The above-described embodiment has mainly described a case where either one of the first and second wiring electrodes of the present invention is provided on the piezoelectric substrate and the other wiring electrodes are provided on the circuit board.

However, this embodiment is not limited to this, and can also be constructed in such a way that (1) either one of the first and second wiring electrodes is formed on the piezoelectric substrate and the other wiring electrode is an inner layer electrode of the circuit board on which the piezoelectric substrate is to be mounted (see FIG. 13) or (2) either one of the first and second wiring electrodes is formed on the circuit board on which the piezoelectric substrate is to be mounted and the other wiring electrode is an inner layer electrode of the circuit board (figure of which is omitted).

Figure 13:
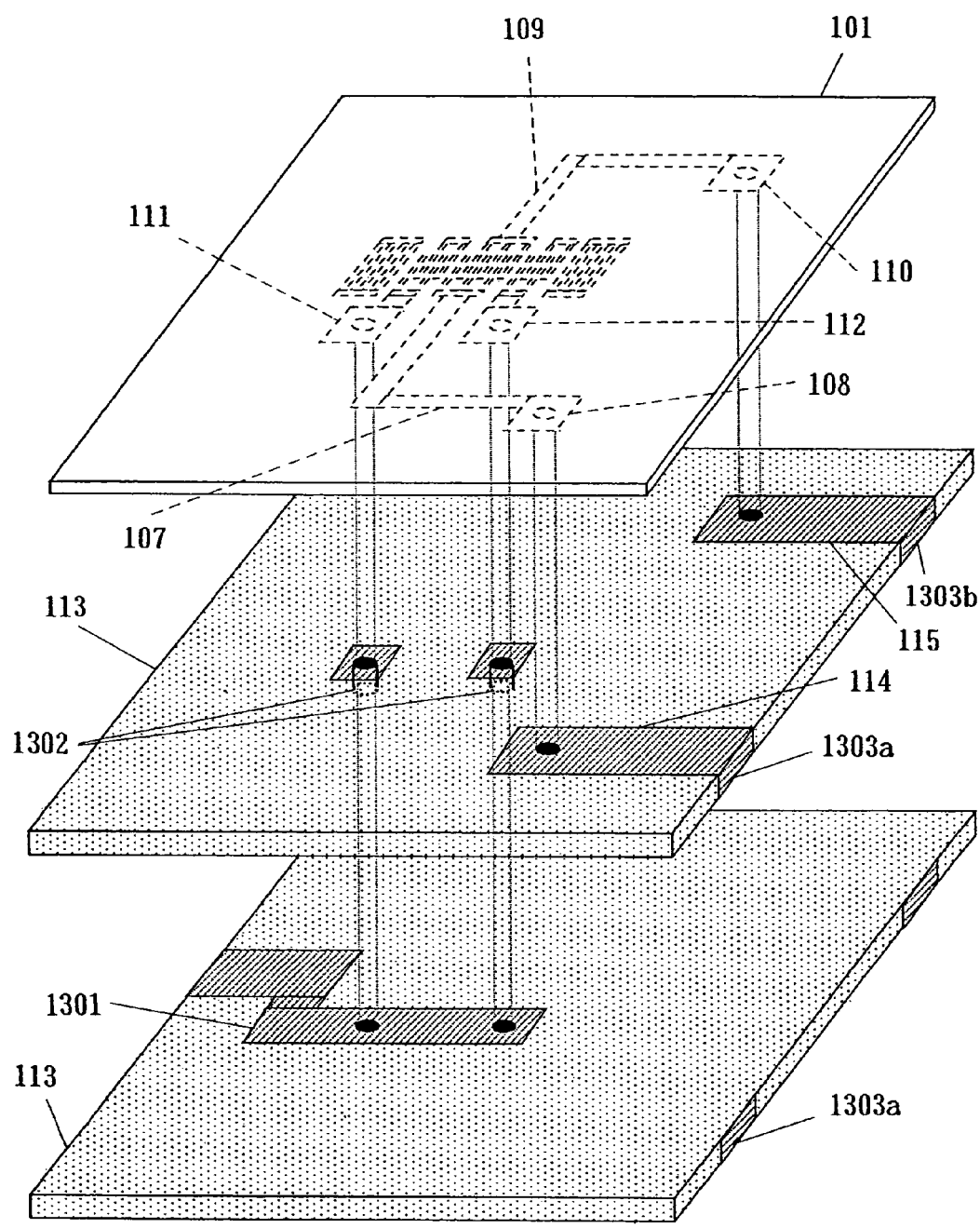
FIG. 13 is an exploded perspective view of a surface acoustic wave filter as a modified embodiment of the present invention.

Here, FIG. 13 is an exploded perspective view of the first configuration example, and unlike the case of FIG. 12, the wiring electrode corresponding to the second wiring elec trode of the present invention is formed on the inner layer plane of the circuit board as the inner layer electrode 1301. The inner layer electrode 1301 is connected to the third and fourth electrode pads 111 and 112 through via holes 1302. By the way, the terminal electrodes 1303a and 1303b are electrically connected to the surface layer electrodes 114 and 115 on the circuit board. Furthermore, the last example will be explained using FIG. 13. The first and second wiring electrodes 107 and 109 corresponding to the first wiring electrode means of the present invention shown in FIG. 13 can be formed as the surface layer on the circuit board instead of the piezoelectric substrate. Or the above-described configuration explained using FIG. 13 indicates a case where the first wiring electrode means and second wiring electrode means of the present invention have a relationship between a surface layer electrode and inner layer electrode, but it is also possible to adopt a configuration where the relationship between the two is reversed, that is, the first wiring electrode means of the present invention is the inner layer electrode of the circuit board and the second wiring electrode means of the present invention is the surface layer electrode.

Figure 14:
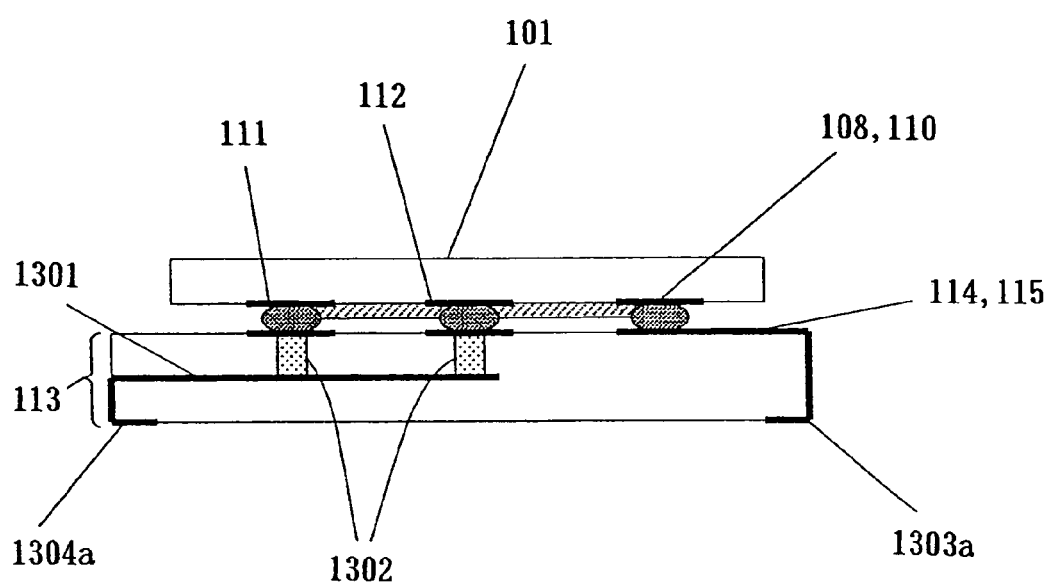
FIG. 14 is a schematic view of the configuration example in FIG. 13.

FIG. 14 shows a schematic view of the configuration example in FIG. 13. In FIG. 14, the piezoelectric substrate 101 and circuit board 113 are expressed as if they were transparent for convenience's sake. Furthermore, an oblique line area in the drawing schematically shows the locations of the surface acoustic wave filter electrodes.

Furthermore, using FIG. 5A, the above embodiment has described the case where the third electrode pad 505 is connected to the electrode finger 403a on one side of the second IDT electrode 403 and the fourth electrode pad 506 is connected to the electrode finger 404b on the other side of the third IDT electrode 404 and the electrode finger 404b on the other side is provided on the opposite side of the above electrode finger 403a on one side.

Figure 15:
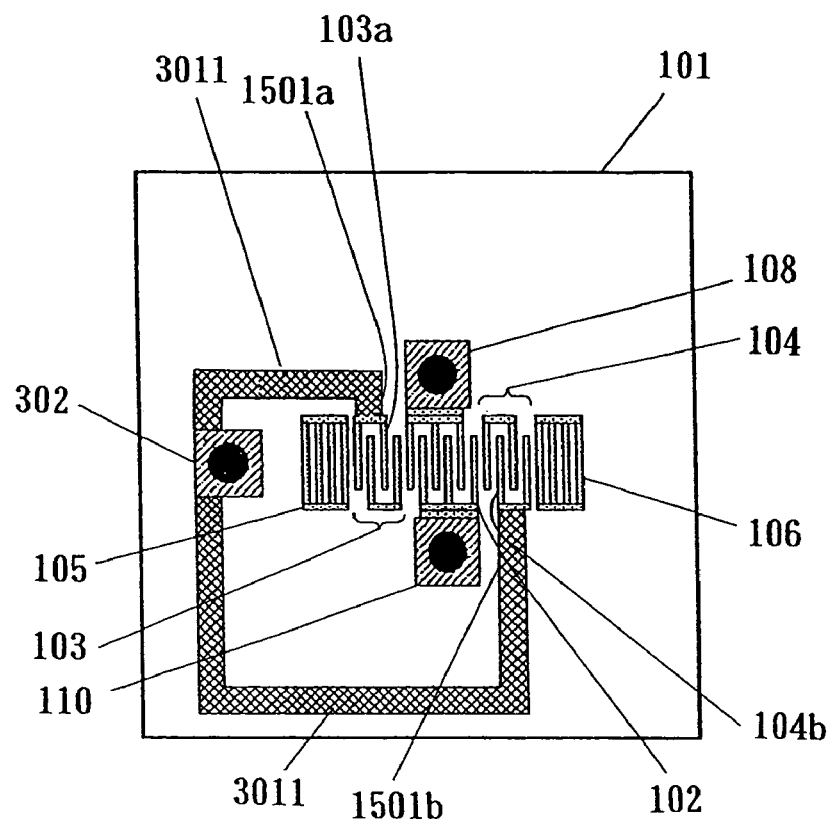
FIG. 15A is a schematic view of a configuration of a modified example of the surface acoustic wave filter element according to the embodiment shown in FIG. 3A.
FIG. 15B illustrates a surface layer of the circuit board corresponding to the modified example shown in FIG. 15A.
Figure 15:
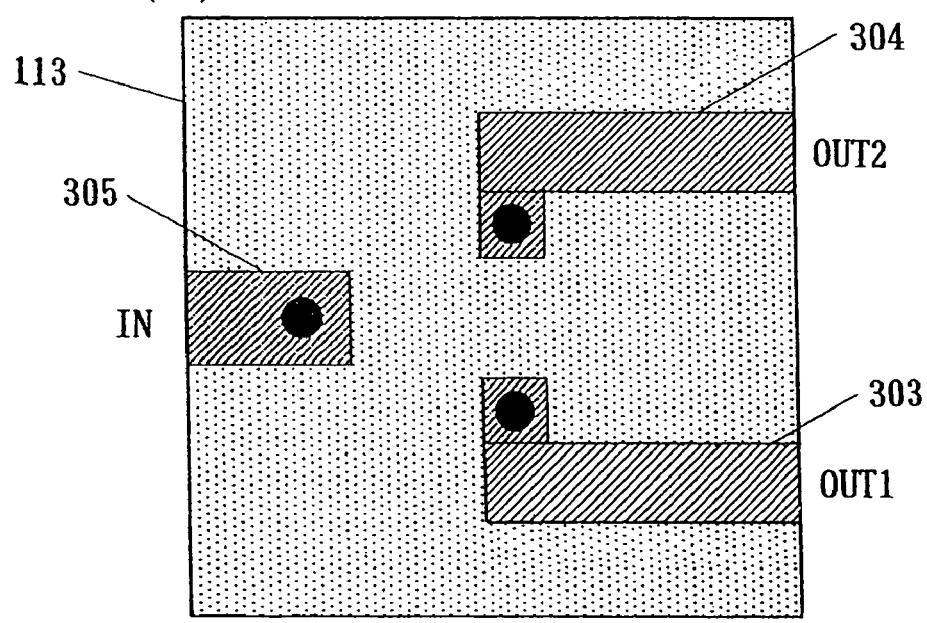

However, this embodiment is not limited to this and can also be, for example, a surface acoustic wave filter element as shown in FIG. 15A, in which one end 1501a of the second wiring electrode means 3011 of the present invention is connected to one electrode finger 103a of the second IDT electrode 103 and the other end 1501b of the second wiring electrode means 3011 is connected to the other electrode finger 104b of the third IDT electrode 104 and the other electrode finger 104b is provided on the opposite side of the electrode finger 103a on one side.

This case also has the same effects as those of the above-described embodiment. FIG. 15A is a schematic view showing a configuration of a modified example of the surface acoustic wave filter element according to the embodiment shown in FIG. 3A. FIG. 15B illustrates a surface layer of the circuit board corresponding to the modified example shown in FIG. 15A.

Figure 16:
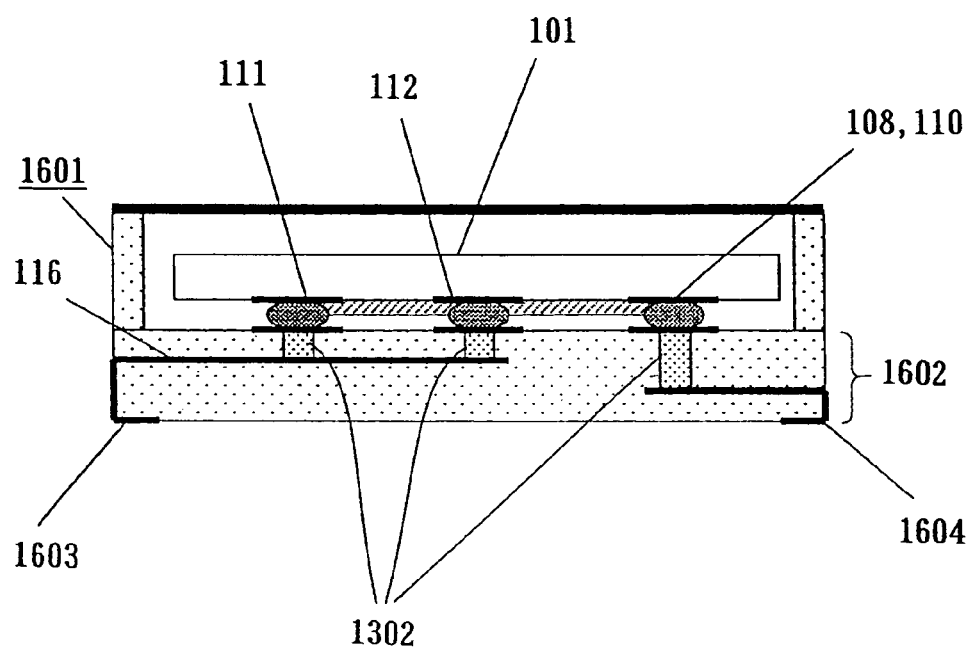
FIG. 16 is a schematic view of a configuration of a package type as another example of the surface acoustic wave filter of the present invention.
Figure 17:
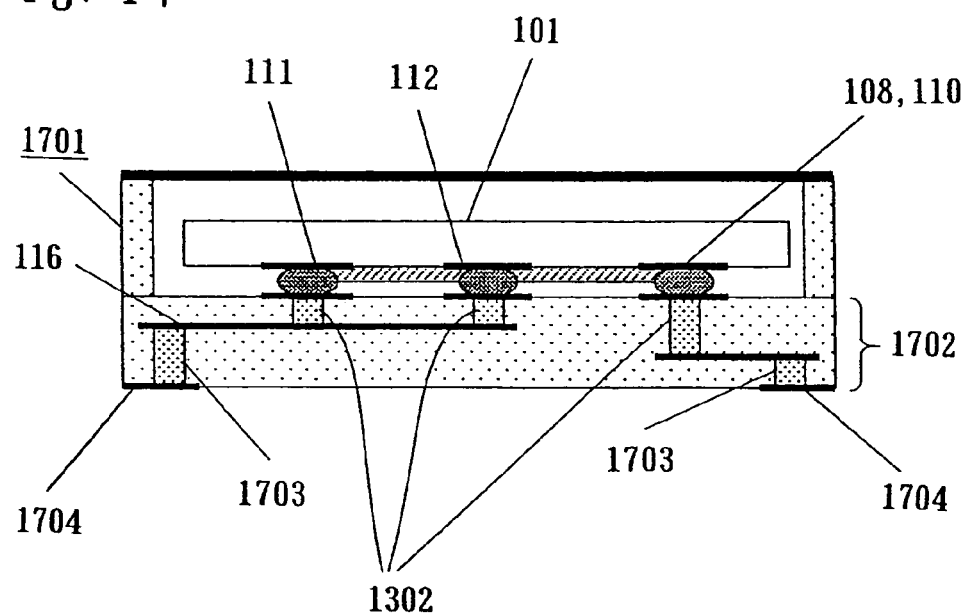
FIG. 17 is a schematic view showing another configuration of the package type surface acoustic wave filter of the present invention.

Furthermore, the above-described embodiment has mainly described a configuration having a piezoelectric substrate and a circuit board. However, this embodiment is not limited to this, and the surface acoustic wave filter can also be constructed of, for example, a piezoelectric substrate and a package. In this case, for example, as shown in FIG. 16 and FIG. 17, it is also possible to adopt a configuration where the lower part of the ceramic packages 1601 and 1701 also serve as the circuit boards 1602 and 1702. In FIG. 16, reference numerals 1603 and 1604 denote external terminals. The configuration in FIG. 17 is different from that in FIG. 16 in that the inner layer electrode 116 and external terminals (bottom face electrodes) 1704 are electrically connected through via holes 1703.

Here, FIG. 16 and FIG. 17 are schematic views illustrating a configuration example where the surface acoustic wave filter is constructed of a piezoelectric substrate and package as if they were transparent just as with FIG. 14. The shaded area in the drawings schematically shows the locations of the electrodes of the surface acoustic wave filter.

The above embodiment has described examples of the surface acoustic wave filter element and surface acoustic wave filter where the first wiring electrode means of the present invention and the second wiring electrode means of the present invention are disposed on different planes, and as specific examples of the different planes above, the embodiment has described a case where a piezoelectric substrate and a circuit board are used (e.g. FIG. 1, FIG. 3, FIG. 5 and FIG. 15) and a case where the surface layer plane and inner layer plane of the circuit board are used, etc.

Figure 18:
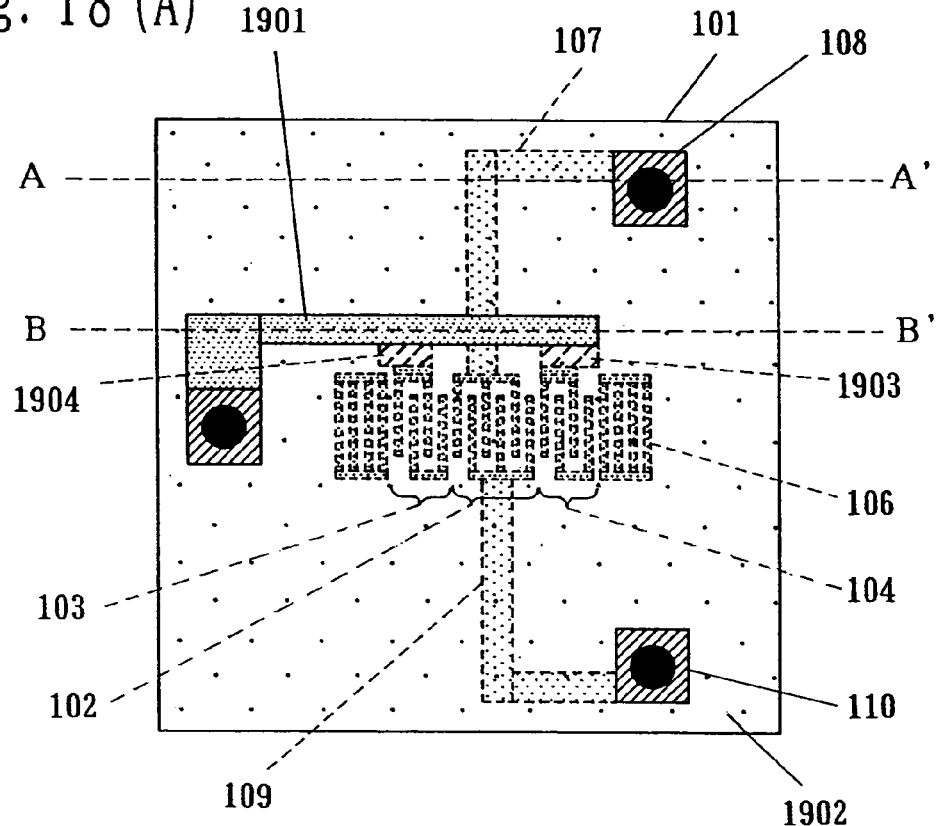
FIG. 18A is a schematic view of another example of the surface acoustic wave filter element of the present invention.
FIG. 18B illustrates a surface layer of the circuit board corresponding to the surface acoustic wave filter element in FIG. 18A.
Figure 18:
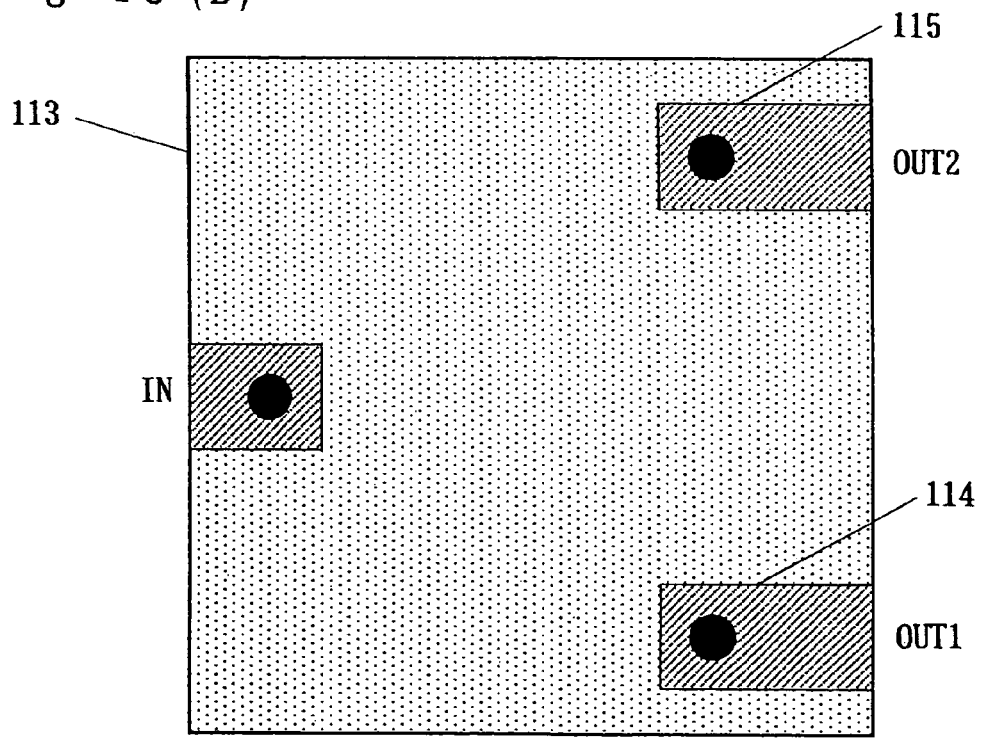
Figure 19:
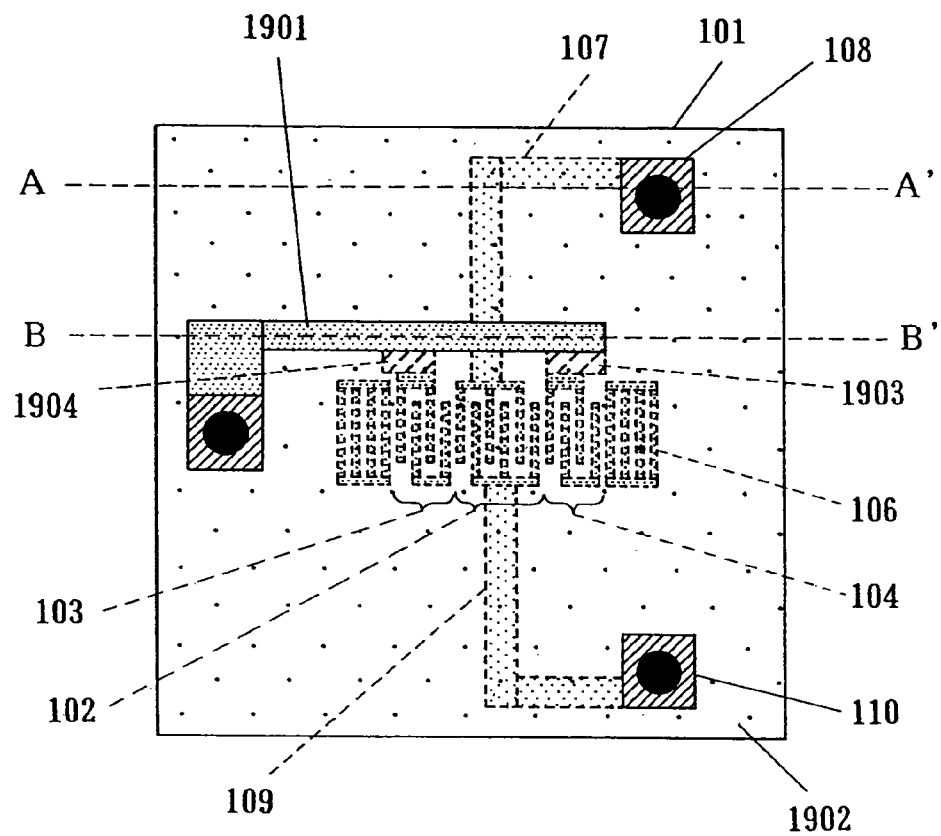
FIG. 19A is a schematic view of another example of the surface acoustic wave filter element of the present invention.
FIG. 19B is a cross-sectional view at A–A' of the surface acoustic wave filter element in FIG. 19A.
FIG. 19C is a cross-sectional view at B–B' of the surface acoustic wave filter element in FIG. 19A.
Figure 19:
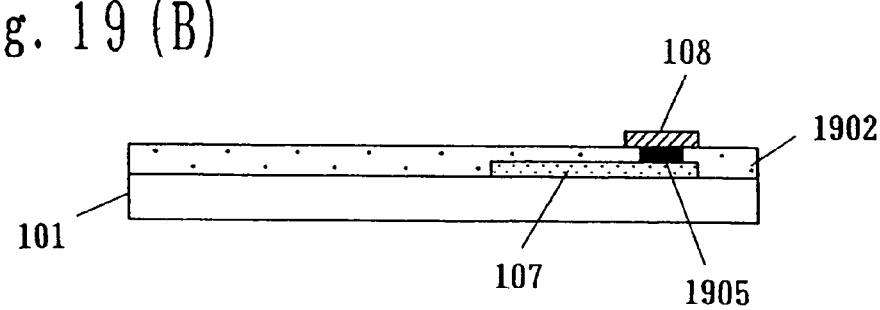
Figure 19:
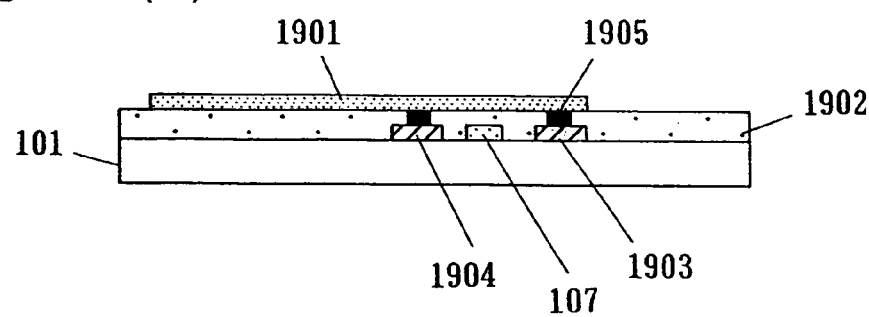

However, this embodiment is not limited to these cases, for example, as shown in FIG. 18 and FIG. 19, it is also possible to achieve the same effects as those described above using a surface acoustic wave filter element in which one of the first and second wiring electrodes of the present invention (107 and 109 in FIG. 18A to FIG. 19C) is provided on the piezoelectric substrate (113 in FIG. 18B) and the other wiring electrode (1901 in FIG. 19C) is provided on a protective film (1902 in FIG. 19C) formed on the piezoelectric substrate.

By the way, as shown in FIG. 19B and FIG. 19C, the wiring electrode 1901 is electrically connected to the electrodes 1903 and 1904 through a via hole 1905. Furthermore, the electrode pad 108 is electrically connected to the wiring electrode 107 through a via hole 1906.

Especially, using a dielectric thin film such as silicon oxide or silicon nitride for this protective film also has a passivation effect of IDT electrodes as well as an effect of improving a temperature characteristic.

Furthermore, connections of electrode pads are not limited to via holes but can be any configuration if it at least allows electric connections.

Furthermore, in Embodiments 1 and 2 of the present invention, if the effective relative dielectric constant of the piezoelectric substrate is greater, the effect is also greater and a piezoelectric substrate having an effective relative dielectric constant of 40 or higher such as $LiTaO_3$ and $LiNbO_3$, etc. can obtain sufficient effects.

Furthermore, Embodiments 1 and 2 of the present invention have described the case of using a 3-electrode longitudinally coupled mode filter, but a 2-electrode, 4-electrode or 5-electrode longitudinally coupled mode filter can also achieve similar effects with respect to the balance characteristic if coupling between the input side and output side becomes smaller as with these embodiments of the present invention. Furthermore, not only a multi-electrode longitudinally coupled mode surface acoustic wave filter but also ladder type or symmetric lattice type filter configuration that uses a surface acoustic wave resonator can achieve similar effects with respect to the balance characteristic if such a filter has a configuration that will reduce coupling between the input side and output side.

Furthermore, this embodiment has described the 1-stage surface acoustic wave filter element, but it is also possible to adopt a configuration having a plurality of surface acoustic wave filter elements cascaded in multiple stages.

Furthermore, as the number of IDT electrodes increases, the wiring on the piezoelectric substrate becomes more complicated and parasitic components between wiring electrodes also increase, and therefore there are expectations for greater effects of improvement in the balance characteristic of the present invention.

Furthermore, Embodiments 1 and 2 have described a balanced-unbalanced type surface acoustic wave filter element and a balanced-unbalanced type surface acoustic wave filter, but even a balanced-balanced type surface acoustic wave filter etc. can also attain similar effects with regard to the balance characteristic if it has a configuration of at least reducing coupling between the input side and output side.

Further, Embodiments 1 and 2 adopt an unbalanced type for the input side and a balanced type for the output side, but the opposite relation can also attain the same effect.

Figure 20:
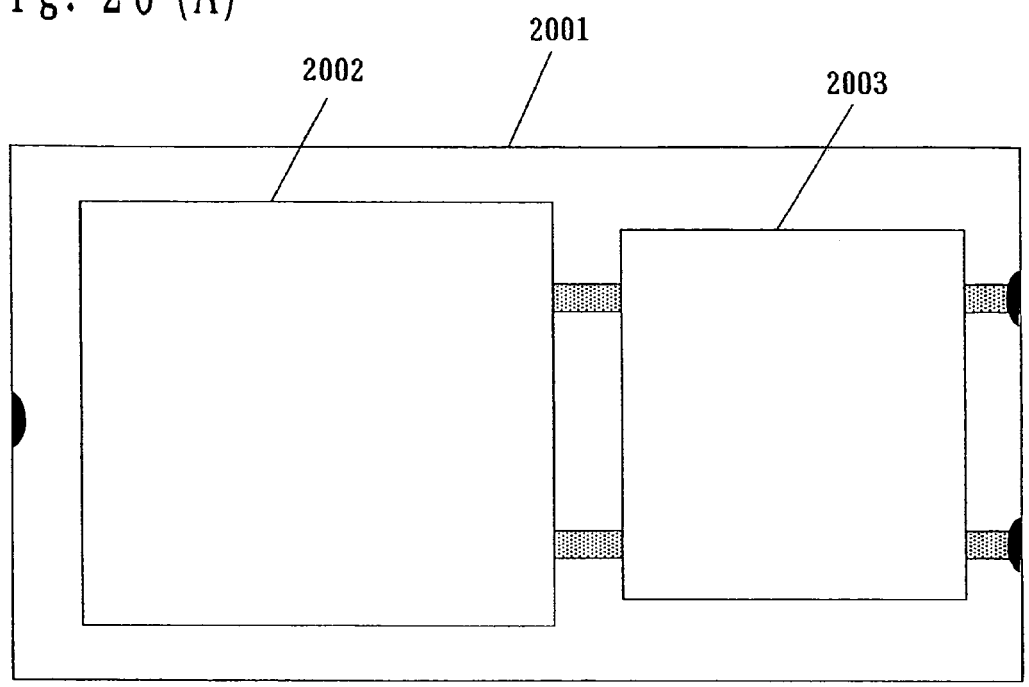
FIG. 20A is a schematic view of a module configuration example according to the present invention.
FIG. 20B is a schematic view of FIG. 20A seen from one side.
Figure 20:
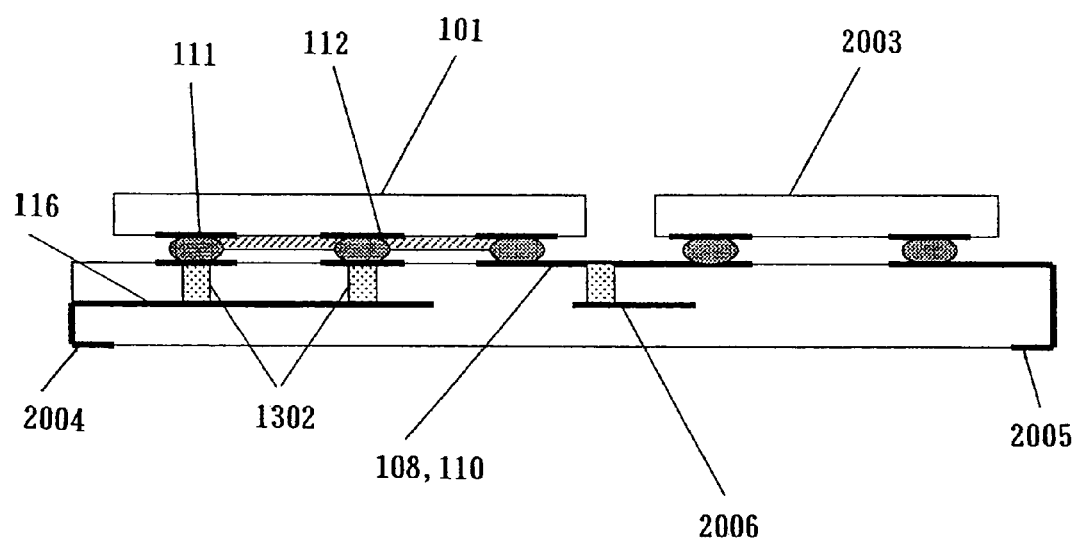

Furthermore, as shown in FIG. 20A and FIG. 20B, mounting a surface acoustic wave filter element 2002 and a semiconductor IC 2003 of the present invention on a circuit board 2001 as modules makes it possible to make the entire apparatus compact and at the same time reduce deterioration of sensitivity due to deterioration of the balance characteristic. In the same drawings, reference numerals 2004 and 2005 denote external terminals and reference numeral 2006 denotes a matching circuit. FIG. 20A is a plan view of modules and FIG. 20B is a schematic view to illustrate the configuration example thereof as if they were transparent just as with FIG. 14. The shaded area in the drawing schematically shows locations of the electrodes of the surface acoustic wave filter.

Furthermore, the above module can also be constructed in such a way that the semiconductor device constitutes a low-noise amplifier. Or the semiconductor device can also be a mixer.

Furthermore, the above Embodiment has described that the semiconductor device is of a balanced type, but it is also possible to be incorporated a unbalanced-balanced type surface acoustic wave filter with a unbalanced-unbalanced type device such as a GaAs-switch or switch using PIN diode.

Figure 21:
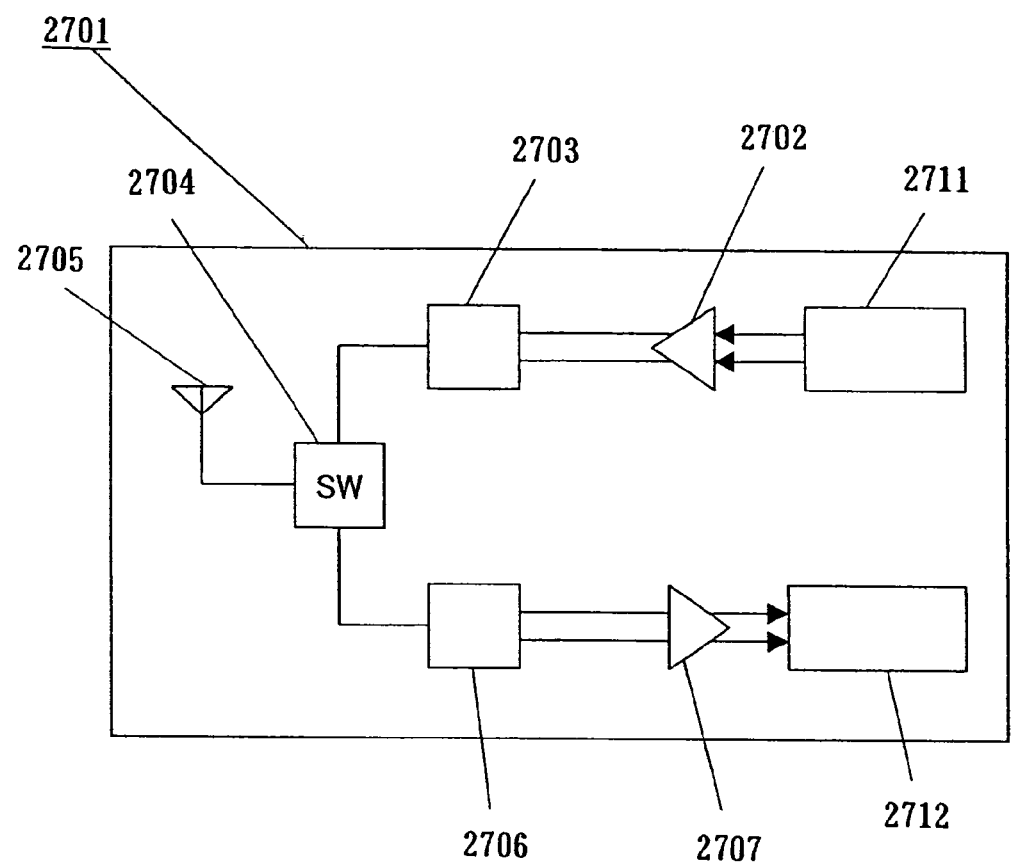
FIG. 21 is a block diagram illustrating an example of application of the surface acoustic wave filter of the present invention to a communication device.

Furthermore, it is also possible to apply the surface acoustic wave filter element or surface acoustic wave filter of the present invention to a communication device etc. provided with a balanced type high frequency circuit as shown in FIG. 21. This makes it possible to suppress deterioration of sensitivity due to deterioration of the balance characteristic of a transmission or reception filter, realizing a high performance mobile communication device.

The configuration and operation of the communication device provided with the above-described balanced type high frequency circuit will be explained below with reference to FIG. 21. Here, FIG. 21 is a block diagram illustrating a balanced type high frequency circuit 2701 using a balanced type device of the present invention.

In FIG. 21, a transmission signal output from a transmission circuit 2711 is sent out from an antenna 2705 through a transmission amplifier 2702, a transmission filter 2703 and a switch 2704.

Furthermore, a reception signal received from the antenna 2705 is input to a reception circuit 2712 through the switch 2704, a reception filter 2706 and a reception amplifier 2707.

Here, the transmission amplifier 2702 is of a balanced type and the switch 2704 is of an unbalanced type, and therefore the transmission filter 2703 has a configuration with unbalanced-balanced type input/output terminals. Furthermore, the reception amplifier 2707 is of a balanced type and the switch 2704 is of an unbalanced type, and therefore the reception filter 2706 has a configuration with unbalanced-balanced type input/output terminals.

Applying the surface acoustic wave filter of the present invention to the transmission filter 2703 and/or the reception filter 2706 can also suppress deterioration of modulation accuracy during transmission due to deterioration of the balance characteristic. Furthermore, doing so also makes it possible to suppress deterioration of sensitivity during reception due to deterioration of the balance characteristic and realize a high performance balanced type high frequency circuit.

Furthermore, it is also possible to adopt the aforementioned modular configuration for the transmission filter 2703 and transmission amplifier 2702 or reception filter 2706 and reception amplifier 2707.

Furthermore, it is also possible to adopt the aforementioned modular configuration for the switch element and reception filter or the switch element and transmission filter.

As is apparent from the above-described explanations, the present invention has an advantage of satisfactory balance characteristics.

What is claimed is:

1. A surface acoustic wave filter comprising:
a piezoelectric substrate;
an insulation film formed on a main surface of said piezoelectric substrate,
a surface acoustic wave filter element formed on said main surface of said piezoelectric substrate or formed above said insulation film, and
a first wiring electrode and a second wiring electrode which are electrically connected to said surface acoustic wave filter element,
wherein
1) either said first wiring electrode is formed on said main surface and said second wiring electrode is formed above said insulation film or 2) said second wiring electrode is formed on said main surface and said first wiring electrode is formed above said insulation film,
said first wiring electrode and said second wiring electrode intersect in an area of the surface acoustic wave filter where the first wiring electrode is formed in a perpendicular direction relative to the second wiring electrode, and
at least a part of said insulation film is disposed between said first wiring electrode and said second wiring electrode in said area.

2. The surface acoustic wave filter according to claim 1, wherein said second wiring electrode is formed above said insulation film and said first wiring electrode is formed on said main surface.

* * * * *